US010838274B2

(12) United States Patent
Kajita

(10) Patent No.: US 10,838,274 B2
(45) Date of Patent: Nov. 17, 2020

(54) LIQUID CRYSTAL DISPLAY PANEL

(71) Applicants:Panasonic Liquid Crystal Display Co., Ltd., Himeji (JP); Pasona Knowledge Partner Inc., Osaka (JP)

(72) Inventor: Daisuke Kajita, Hyogo (JP)

(73) Assignees: PANASONIC LIQUID CRYSTAL DISPLAY CO., LTD., Hyogo (JP); PASONA KNOWLEDGE PARTNER INC., Osaka (JP)

( * ) Notice: Subject to any disclaimer, the term of this patent is extended or adjusted under 35 U.S.C. 154(b) by 0 days.

(21) Appl. No.: 16/154,300

(22) Filed: Oct. 8, 2018

(65) Prior Publication Data

US 2019/0147815 A1 May 16, 2019

(30) Foreign Application Priority Data

Nov. 16, 2017 (JP) ................. 2017-221324

(51) Int. Cl.
*G02F 1/1362* (2006.01)
*G09G 3/36* (2006.01)
(Continued)

(52) U.S. Cl.
CPC ...... *G02F 1/136286* (2013.01); *G02F 1/1343* (2013.01); *G02F 1/1368* (2013.01); (Continued)

(58) Field of Classification Search
CPC ......... G09G 3/3648; G09G 2310/0264; G09G 2300/0426; G09G 2300/08; G09G 2300/0421; G09G 2300/0439; G09G 3/3659; G02F 1/136286; G02F 1/136259; G02F 1/13394; G02F 1/133512; G02F 1/133514; G02F 1/1368; G02F 1/1343; G02F 2001/133357; G02F 1/015; G02F 1/136; G02F 1/1362; G02F 1/136277; G02F 2001/13613; G02F 2001/136281; G02F 1/13439; G02F 1/136209; G02F 1/136227; G02F 1/1365; G02F 2001/136218;
(Continued)

(56) References Cited

U.S. PATENT DOCUMENTS

2007/0252936 A1* 11/2007 Ono ................. G02F 1/134363
349/139
2009/0273751 A1* 11/2009 Ryuzaki ............... G02F 1/1362
349/138

(Continued)

FOREIGN PATENT DOCUMENTS

JP      01-303881      12/1989
JP      2015-114375    6/2015

*Primary Examiner* — Shan Liu
(74) *Attorney, Agent, or Firm* — Hamre, Schumann, Mueller & Larson, P.C.

(57) ABSTRACT

A liquid crystal display panel includes: a plurality of pixels arranged in a matrix; a pixel electrode provided in each of the plurality of pixels; and a plurality of pairs of first video signal lines and second video signal lines provided at each boundary between two pixels adjacent to each other in a first direction. The plurality of pairs of the first video signal lines and the second video signal lines extending in a second direction orthogonal to the first direction. At least a part of the pixel electrode exists between the first video signal line and the second video signal line.

11 Claims, 13 Drawing Sheets

(51) Int. Cl.
*G02F 1/1339* (2006.01)
*G02F 1/1335* (2006.01)
*H01L 27/12* (2006.01)
*G02F 1/1368* (2006.01)
*G02F 1/1343* (2006.01)
*H01L 29/786* (2006.01)
*G02F 1/1333* (2006.01)

(52) U.S. Cl.
CPC .... *G02F 1/13394* (2013.01); *G02F 1/133512* (2013.01); *G02F 1/133514* (2013.01); *G02F 1/136259* (2013.01); *G09G 3/3648* (2013.01); *H01L 27/1214* (2013.01); *H01L 27/1244* (2013.01); *H01L 29/78633* (2013.01); *G02F 2001/133357* (2013.01); *G09G 2300/0426* (2013.01); *G09G 2310/0264* (2013.01)

(58) Field of Classification Search
CPC ........ G02F 2001/136222; G02F 2001/136231; G02F 2001/13625; G02F 2001/1635; G02F 2201/122; G02F 2202/10; G02F 1/134309; G02F 1/155; G02F 1/1393; G02F 1/1395; G02F 1/218; G02F 1/134363; G02F 1/134327; G02F 1/133707; G02F 1/134336; G02F 1/0316; G02F 2001/134318; G02F 2001/134372; G02F 2001/134381; G02F 2001/134345; G02F 2001/1357; G02F 2001/136295; G02F 2001/1552; G02F 2001/1555; G02F 2001/1557; G02F 2001/13629; G02F 2201/12; G02F 2201/121; G02F 2201/124; G02F 2201/123; G02F 2201/14; H01L 27/1214; H01L 29/78633; H01L 27/1244; H01L 27/02; H01L 2021/775; H01L 27/2436; H01L 29/66037; H01L 29/66068; H01L 29/66227; H01L 29/72; H01L 29/786; H01L 2924/1304; H01L 51/0504; H01L 51/0508; H01L 27/124; H01L 27/3276; H01L 27/3297; H01L 27/3279; H01L 27/329; H01L 23/49534; H01L 2933/0016
USPC ..................................... 349/41–43, 139–148
See application file for complete search history.

(56) References Cited

U.S. PATENT DOCUMENTS

| | | | |
|---|---|---|---|
| 2010/0245734 A1* | 9/2010 | Tanno | G02F 1/134363 349/106 |
| 2011/0211145 A1* | 9/2011 | Tsuruma | G02F 1/133512 349/106 |
| 2011/0234949 A1* | 9/2011 | Matsui | G02F 1/133512 349/106 |
| 2012/0218199 A1* | 8/2012 | Kim | G06F 3/0412 345/173 |
| 2014/0125571 A1* | 5/2014 | Um | G09G 3/3614 345/88 |
| 2016/0370636 A1* | 12/2016 | Huang | G02F 1/136286 |
| 2017/0045787 A1* | 2/2017 | Kita | G02F 1/134327 |
| 2017/0045794 A1* | 2/2017 | Lin | G02F 1/134336 |
| 2017/0242310 A1* | 8/2017 | Matsushima | G02F 1/133514 |
| 2017/0255049 A1* | 9/2017 | Nishiyama | G02F 1/13454 |
| 2018/0203319 A1* | 7/2018 | Yamazaki | G02F 1/1368 |

* cited by examiner

LIQUID CRYSTAL DISPLAY PANEL

CROSS-REFERENCE TO RELATED APPLICATION

This application claims priority from Japanese application JP 2017-221324, filed on Nov. 16, 2017. This Japanese application is incorporated herein by reference.

TECHNICAL FIELD

The present invention relates to a liquid crystal display panel.

BACKGROUND

A liquid crystal display panel in which the liquid crystal display panel is used can display an image with low power consumption, so that the liquid crystal display panel is used as an image display device such as a television and a monitor.

The liquid crystal display panel includes a Thin Film Transistor (TFT) substrate on which a pixel electrode and a TFT are formed, a counter substrate opposed to the TFT substrate, and a liquid crystal layer disposed between the TFT substrate and the counter substrate. In the liquid crystal display panel, the image is displayed by controlling light transmittance of the liquid crystal layer in each pixel using a pixel electrode provided in each pixel (see, for example, Unexamined Japanese Patent Publication No. 2015-114375).

SUMMARY

A transverse electric field system such as an In-Plane Switching (IPS) system and a Fringe Field Switching (FFS) system is known as a liquid crystal display panel driving system.

In the transverse electric field type liquid crystal display panel, a technique of forming a comb-shaped pixel electrode with an insulator sandwiched on a planar common electrode is developed in order to increase the light transmittance of a pixel.

However, in the conventional liquid crystal display panel, the image quality is insufficient, and there is a demand for further improving image quality.

This present disclosure provides a liquid crystal display panel excellent in the image quality.

To solve above problem, a liquid crystal display panel according to the present disclosure includes: a plurality of pixels arranged in a matrix; a pixel electrode provided in each of the plurality of pixels; and a plurality of pairs of first video signal lines and second video signal lines provided at each boundary between two pixels adjacent to each other in a first direction, the plurality of pairs of the first video signal lines and the second video signal lines extending in a second direction orthogonal to the first direction. At least a part of the pixel electrode exists between the first video signal line and the second video signal line.

DETAILED DESCRIPTION

The following describes an exemplary embodiment of the present disclosure. The embodiment described below is merely one specific example of the present disclosure. The numerical values, shapes, materials, elements, and arrangement and connection of the elements, etc. indicated in the following embodiment are given merely by way of illustration and are not intended to limit the present disclosure. Therefore, among elements in the following embodiment, those not recited in any one of the independent claims defining the broadest inventive concept of the present disclosure are described as optional elements.

Note that the figures are schematic illustrations and are not necessarily precise depictions. Accordingly, the figures are not necessarily to scale. Moreover, in the figures, elements that are essentially the same share like reference signs. Accordingly, duplicate description is omitted or simplified.

Figure 1:
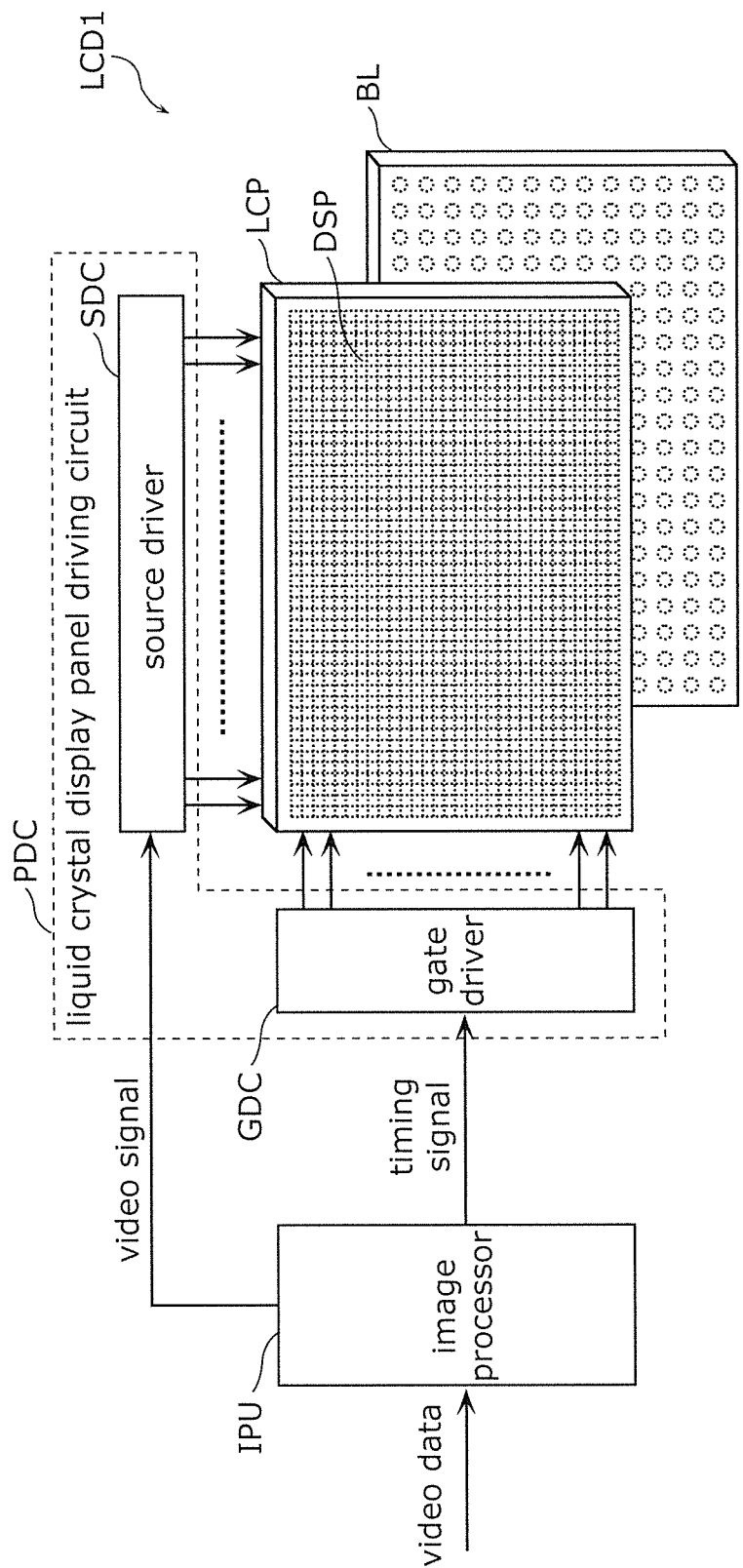
FIG. 1 is a view illustrating a schematic configuration of a liquid crystal display panel according to a first exemplary embodiment.
Figure 2:
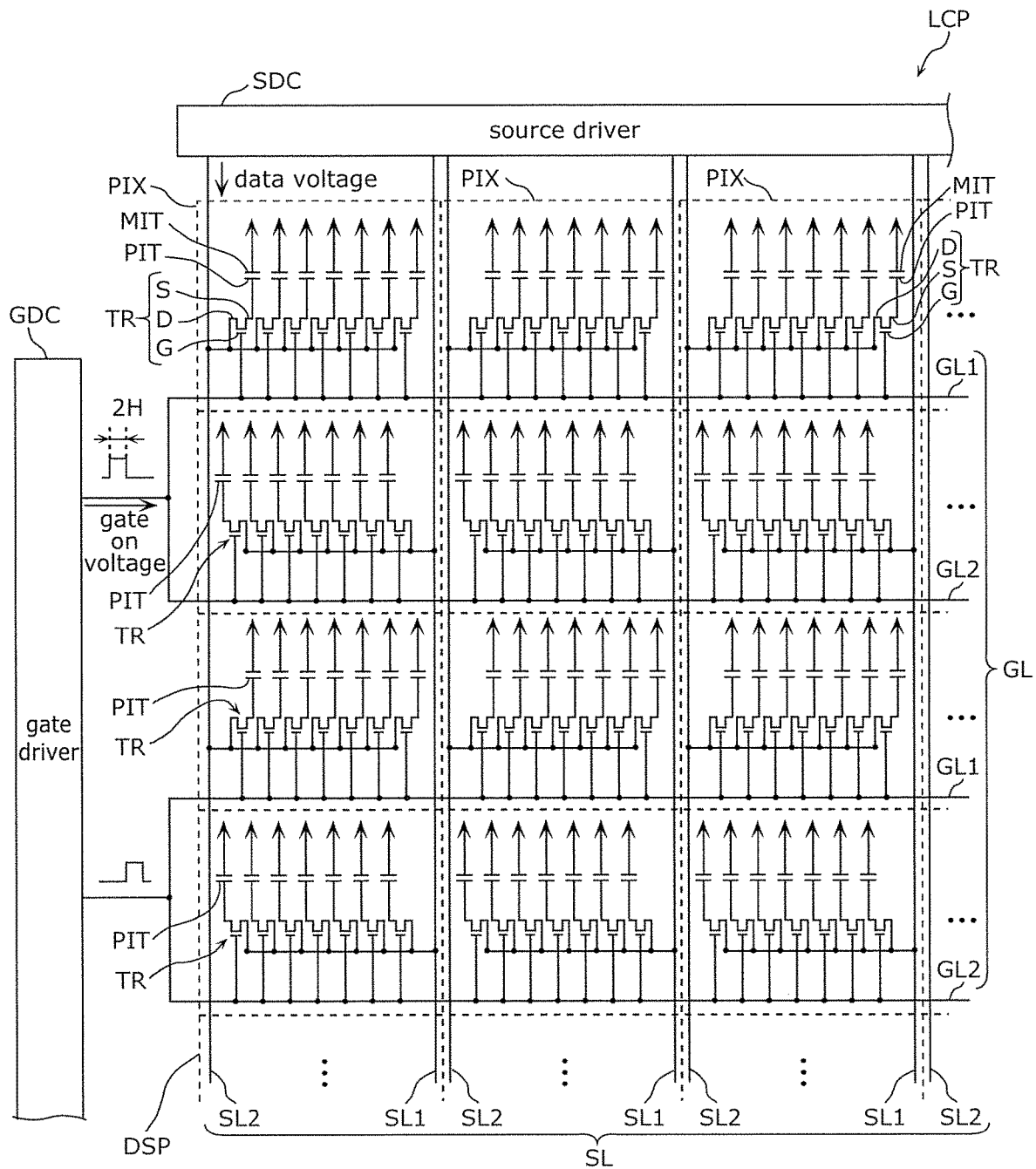
FIG. 2 is a view illustrating a pixel circuit of the liquid crystal display panel of the first exemplary embodiment.

FIG. 1 is a view illustrating a schematic configuration of a liquid crystal display panel LCD1 according to a first exemplary embodiment. FIG. 2 is a view illustrating a pixel circuit of the liquid crystal display panel LCP1 of the first exemplary embodiment;

Liquid crystal display panel LCD1 is an example of an image display device that displays a still image or a moving image. As illustrated in FIG. 1, liquid crystal display panel LCD1 includes liquid crystal display panel LCP, liquid crystal display panel driving circuit PDC (source driver SDC, gate driver GDC), backlight BL, and image processor IPU.

Liquid crystal display panel LCP is disposed on a light emission side of backlight BL. Liquid crystal display panel LCP displays a color image or a monochrome image in image display region DSP. For example, a system for driving liquid crystal display panel LCP is a transverse electric field system such as IPS or FFS. In liquid crystal display panel LCP, for example, voltage is controlled by a normally black system. However, the voltage control system is not limited to the normally black system.

As illustrated in FIGS. 1 and 2, liquid crystal display panel LCP includes a plurality of pixels PIX arranged in a matrix. Image display region DSP in which the image is displayed is constructed with the plurality of pixels PIX arranged in a matrix.

As illustrated in FIG. 2, transistor TR, pixel electrode PIT, and common electrode MIT are provided in each of the plurality of pixels PIX. Transistor TR is a thin film transistor, and includes gate electrode G, source electrode S, and drain electrode D. In the present specification, sometimes source electrode S and drain electrode D are collectively referred to as a source drain electrode, and the source drain electrode means at least one of source electrode S and drain electrode D, only one of source electrode S and drain electrode D, or both source electrode S and drain electrode D. Source electrode S and drain electrode D may be called as a first conductive electrode and a second conductive electrode.

In the first exemplary embodiment, a plurality of transistors TR and a plurality of pixel electrodes PIT are provided in each pixel PIX. Specifically, seven transistors TR and seven pixel electrodes PIT are provided in each pixel PIX. Seven pixel electrodes PIT in one pixel PIX each are a sub-pixel electrode, and are separately formed from each other.

On the other hand, common electrode MIT is provided over the plurality of pixels PIX. In the first exemplary embodiment, common electrode MIT is provided over all pixels PIX in image display region DSP. That is, common electrode MIT is one planar electrode common to all pixels PIX, and is formed over entire image display region DSP.

As illustrated in FIG. 2, a plurality of scanning lines (gate lines) GL extending in a row direction (first direction) and a plurality of video signal lines (source lines) SL extending in a column direction (second direction) orthogonal to the row direction are formed in liquid crystal display panel LCP.

The plurality of scanning lines GL are provided at a corresponding boundary between two pixels PIX adjacent to each other in the column direction. In the first exemplary embodiment, one scanning line GL is provided for each boundary between two pixels PIX adjacent to each other in the column direction.

Each scanning line GL is connected to the plurality of transistors TR of pixel PIX arranged in the row direction. That is, each scanning line GL is connected to the plurality of transistors TR in each pixel PIX. Specifically, each scanning line GL is connected to gate electrode G of each transistor TR.

The plurality of video signal lines SL are provided at a corresponding boundary between two pixels PIX adjacent to each other in the row direction. In the first exemplary embodiment, two video signal lines SL as a pair of first video signal line SL1 and second video signal line SL2 are provided at each boundary between two pixels PIX adjacent to each other in the row direction.

Each video signal line SL is connected to the plurality of transistors TR of pixel PIX arranged in the column direction. Specifically, each video signal line SL is connected to drain electrode D among source electrode S and drain electrode D of each transistor TR. That is, in the first exemplary embodiment, video signal line SL is a drain line.

Liquid crystal display panel LCP has a wiring connection structure of 1G2D, and each two of the plurality of scanning lines GL are connected to each other in the column direction. That is, two adjacent scanning lines GL of first scanning line GL1 in the odd-numbered row and second scanning line GL2 in the even-numbered row are connected to each other. For example, first scanning line GL1 and second scanning line GL2 may be connected by a wiring pattern on the side of gate driver GDC or in gate driver GDC.

Drain electrode D of transistor TR to which one of two scanning lines GL connected to each other is connected is connected to one of first video signal line SL1 and second video signal line SL2. Drain electrode D of transistor TR to which the other of two scanning lines GL connected to each other is connected is connected to the other of first video signal line SL1 and second video signal line SL2.

Specifically, drain electrode D of transistor TR to which first scanning line GL1 in the odd-numbered row is connected is connected to second video signal line SL2, and drain electrode D of transistor TR to which second scanning line GL2 in the even-numbered row is connected is connected to first video signal line SL1.

In each pixel PIX, source electrode S of transistor TR is connected to pixel electrode PIT. Specifically, source electrodes S of seven transistors TR and seven pixel electrodes PIT are connected to each other in a one-to-one manner.

As illustrated in FIG. 1, liquid crystal display panel driving circuit PDC is connected to liquid crystal display panel LCP in order to display the image corresponding to an input video signal. Liquid crystal display panel driving circuit PDC includes source driver SDC and gate driver GDC. For example, source driver SDC and gate driver GDC are driver ICs (IC packages), and are mounted on a printed wiring board. The printed wiring board on which source driver SDC is mounted and the printed wiring board on which gate driver GDC is mounted are connected to liquid crystal display panel LCP through a flexible wiring board such as a Flexible Flat Cable (FFC) or a Flexible Printed Cable (FPC).

As illustrated in FIG. 2, source driver SDC is connected to video signal line SL of liquid crystal display panel LCP. In response to selection of scanning line GL by gate driver GDC, source driver SDC supplies, to video signal line SL, voltage (data voltage) corresponding to the video signal input from image processor IPU. Specifically, source driver SDC supplies the data voltage to each of first video signal line SL1 and second video signal line SL2.

Gate driver GDC is connected to scanning line GL. Gate driver GDC selects pixel PIX in which the video signal is written according to a timing signal input from image processor IPU, and supplies the voltage (gate-on voltage) turning on transistor TR of selected pixel PIX to scanning line GL. In the first exemplary embodiment, each two scanning lines GL are connected to each other, so that gate driver GDC supplies a gate pulse signal of double gate Hi periods (2H) to scanning line GL as the gate-on voltage common to first scanning lines GL1 and second scanning line GL2, which are connected to each other. Consequently, the data voltage is supplied to pixel electrode PIT of selected pixel PIX through transistor TR. A common voltage is supplied from a common driver (not illustrated) to common electrode MIT.

In this way, when the gate-on voltage is supplied from gate driver GDC to the scanning line GL, transistor TR of selected pixel PIX is turned on, and the data voltage is supplied from video signal line SL connected to transistor TR to pixel electrode PIT. An electric field is generated in a liquid crystal layer due to a difference between the data voltage supplied to pixel electrode PIT and the common voltage supplied to common electrode MIT. An alignment state of liquid crystal molecules of the liquid crystal layer in each pixel PIX is changed by the electric field, and transmittance of light of backlight BL passing through liquid crystal display panel LCP is controlled in each pixel PIX. Consequently, the desired image is displayed in the display region (pixel region) of liquid crystal display panel LCP.

As illustrated in FIG. 1, backlight BL is disposed on a back side of liquid crystal display panel LCP, and emits the light toward liquid crystal display panel LCP. In the first exemplary embodiment, backlight BL is a Light Emitting Diode (LED) backlight in which an LED is used as a light source. However, backlight BL is not limited to the LED backlight. Backlight BL is a direct under type LED backlight in which LEDs are two-dimensionally arranged on a substrate so as to face liquid crystal display panel LCP. However, backlight BL may be an edge type LED backlight. Backlight BL is a surface-emitting unit that emits planar, uniform scattered light (diffused light). In this case, backlight BL may include an optical member, such as a diffuser (a diffusion sheet), which diffuses the light emitted from the light source.

Image processor IPU is a control device including an arithmetic processing circuit such as a CPU and a memory such as a ROM and a RAM. Image data is input to image processor IPU in order to display the image on liquid crystal display panel LCP. A CPU reads and executes a program stored in the memory, whereby the image processor IPU performs various pieces of processing. Specifically, image processor IPU performs various pieces of image signal processing such as color adjustment on the video data input from an external system (not illustrated) to generate the video signal indicating a gray scale value of each pixel PIX and the timing signal indicating timing of writing the video signal in each pixel PIX, and outputs the video signal to source driver SDC while outputting the timing signal to gate driver GDC.

Figure 3:
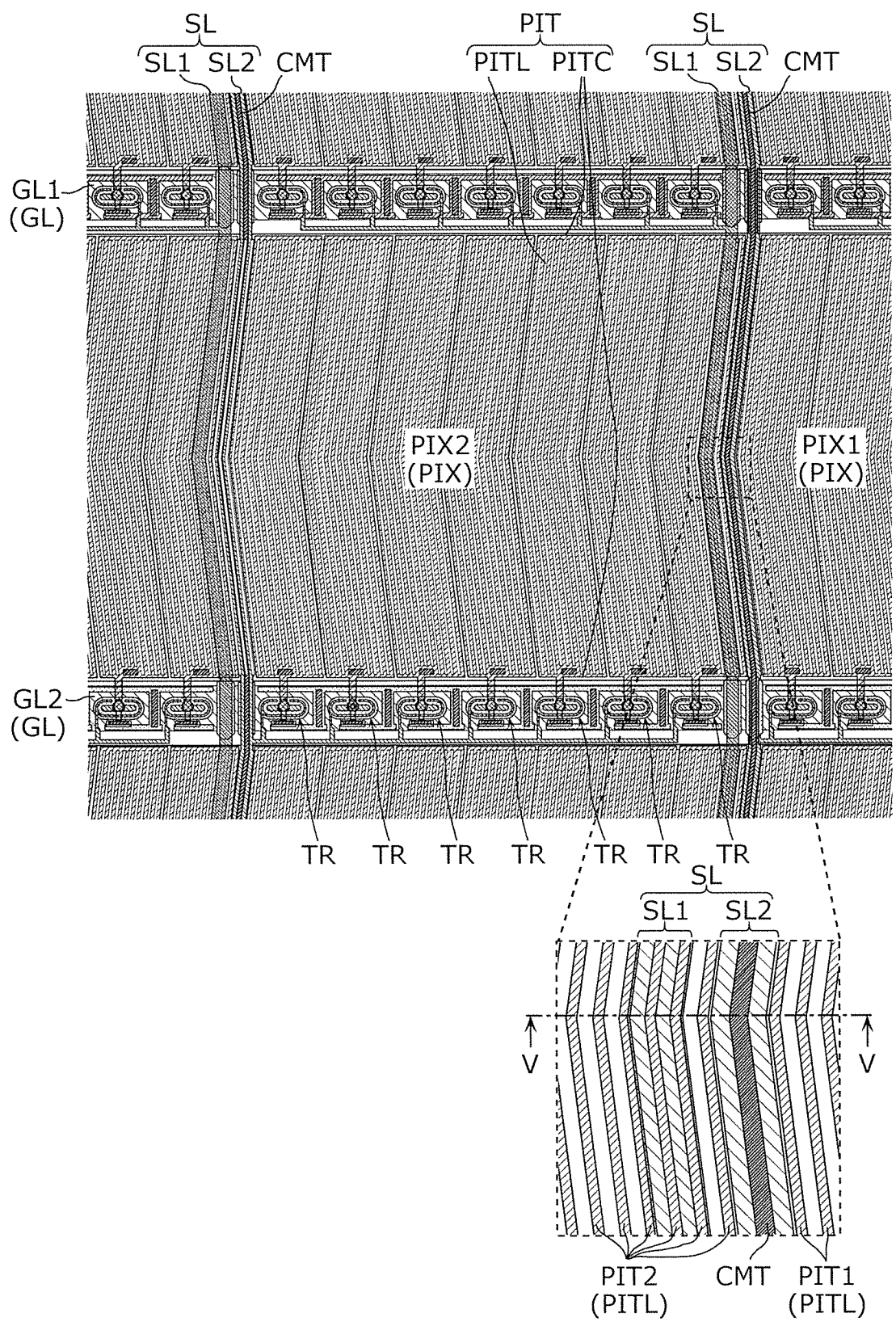
FIG. 3 is a plan view illustrating a configuration of a pixel in the liquid crystal display panel of the first exemplary embodiment.
Figure 4:
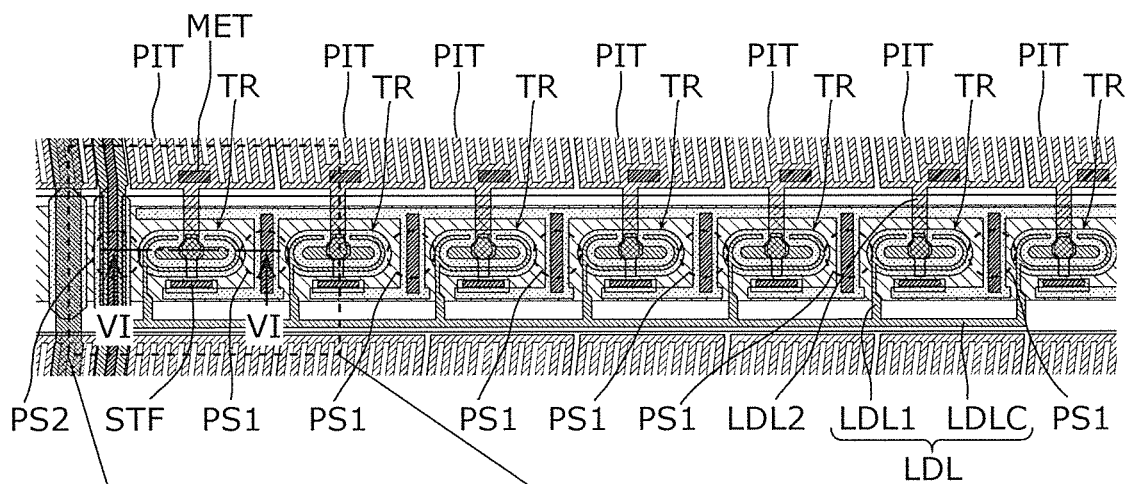
FIG. 4 is an enlarged plan view illustrating a periphery of a transistor of the pixel in the liquid crystal display panel of the first exemplary embodiment.
Figure 4:
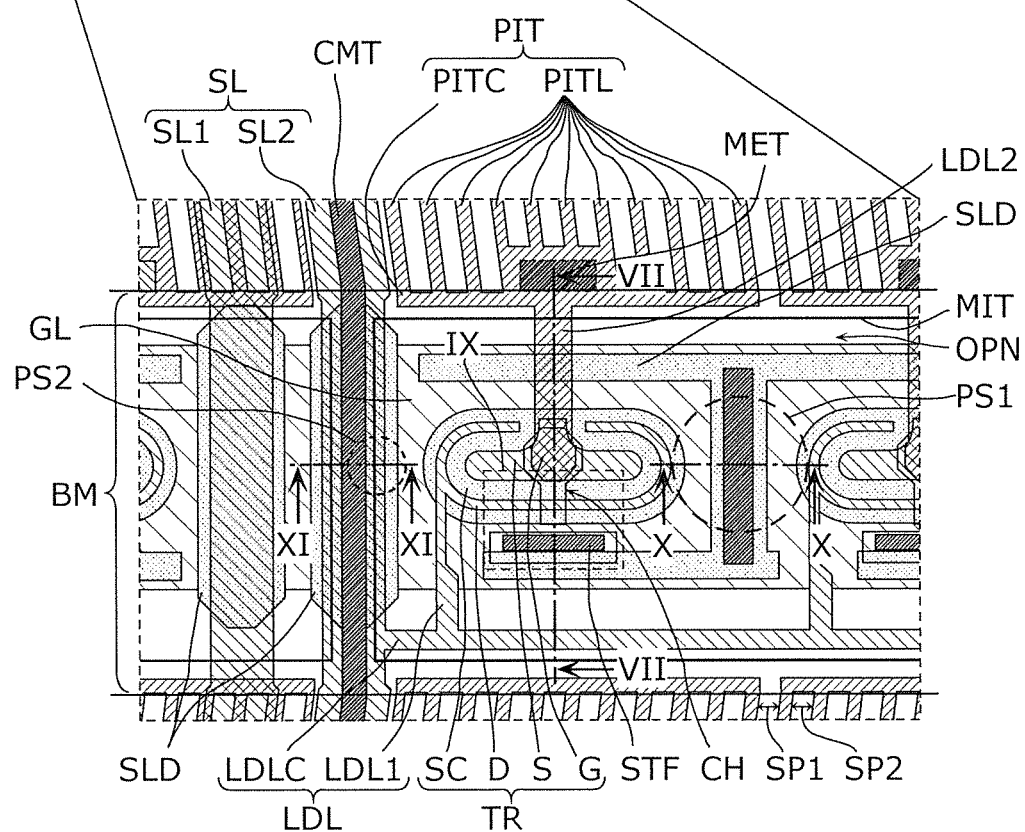
Figure 5:
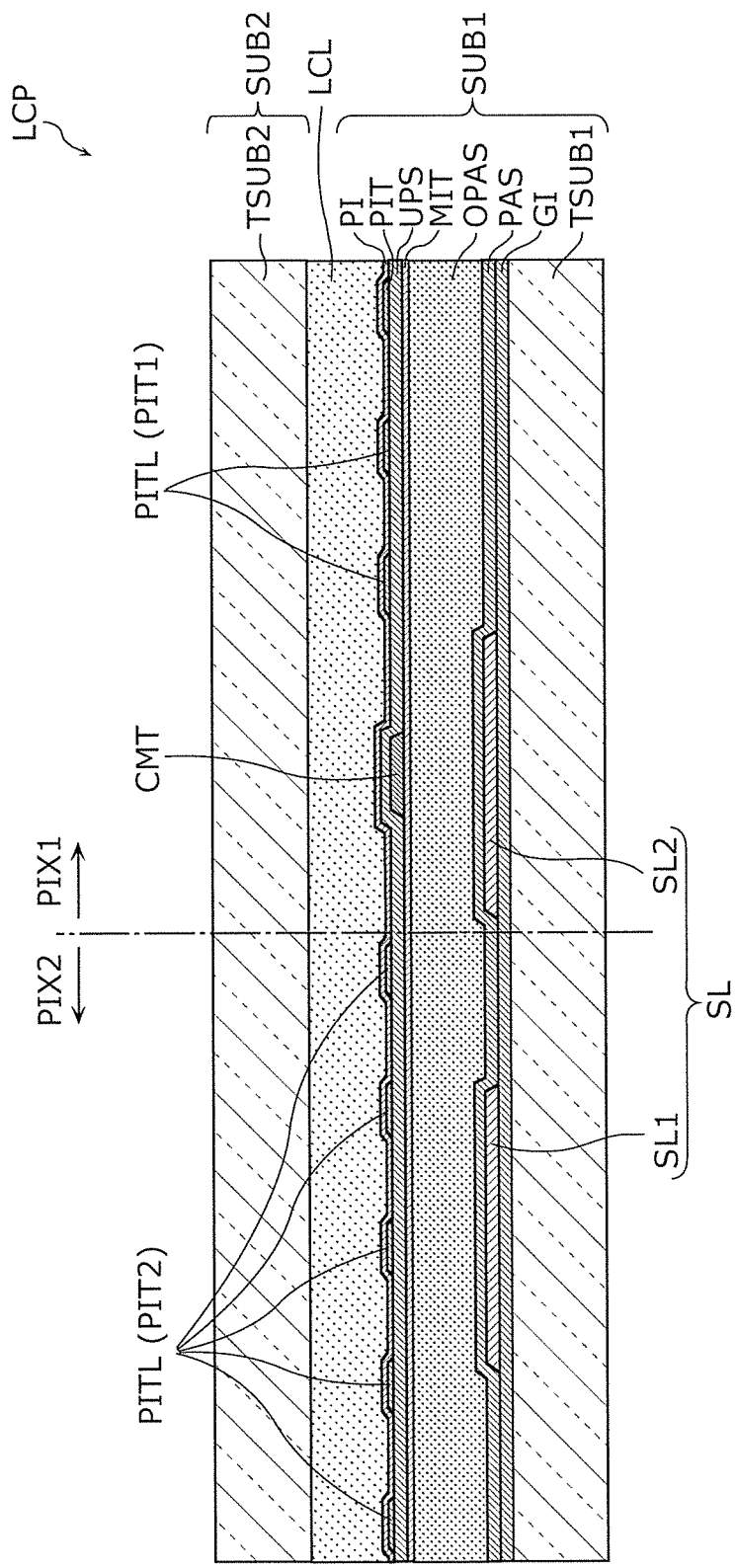
FIG. 5 is a sectional view taken along a line V-V in FIG. 3 in the liquid crystal display panel of the first exemplary embodiment.
Figure 6:
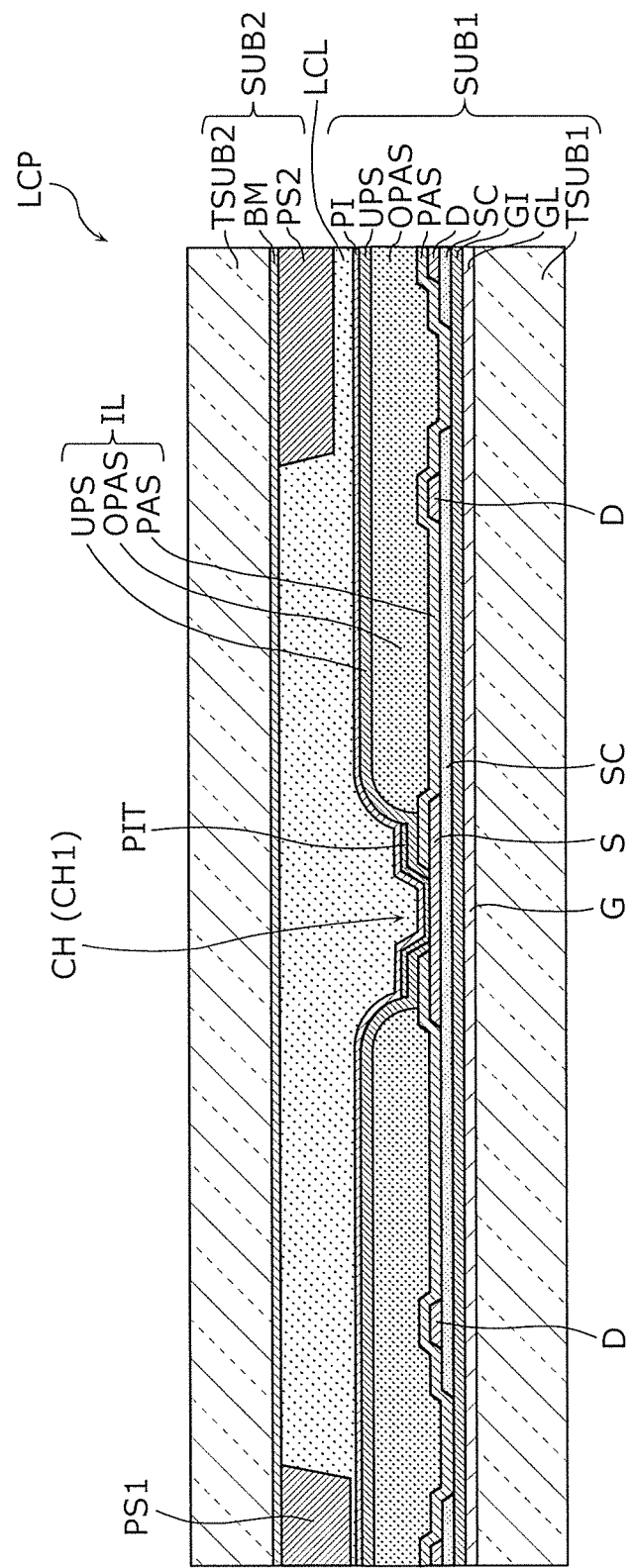
FIG. 6 is a sectional view taken along a line VI-VI in FIG. 4 in the liquid crystal display panel of the first exemplary embodiment.
Figure 7:
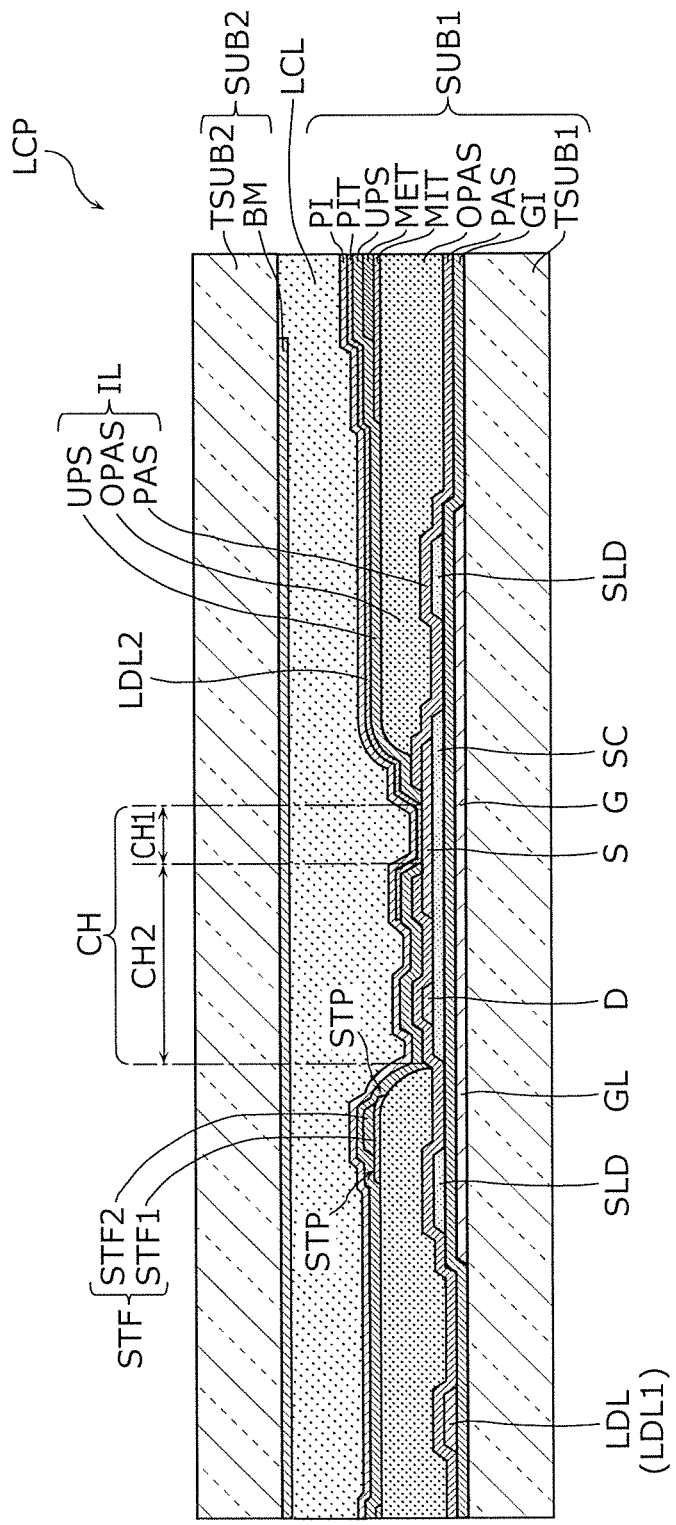
FIG. 7 is a sectional view taken along a line VII-VII of FIG. 4 in the liquid crystal display panel of the first exemplary embodiment.

A specific structure of liquid crystal display panel LCP will be described with reference to FIGS. 2 to 7. FIG. 3 is a plan view illustrating a configuration of pixel PIX in liquid crystal display panel LCP of the first exemplary embodiment. FIG. 4 is an enlarged plan view illustrating a periphery of transistor TR of the pixel PIX in liquid crystal display panel LCP. FIG. 5 is a sectional view taken along a line V-V in FIG. 3 in liquid crystal display panel LCP. FIG. 6 is a sectional view taken along a line VI-VI in FIG. 4 in liquid crystal display panel LCP. FIG. 7 is a sectional view taken along a line VII-VII in FIG. 4 in liquid crystal display panel LCP.

As illustrated in FIGS. 2 and 3, each pixel PIX is a region surrounded by a scanning line GL extending in the row direction and the video signal line SL extending in the column direction. In the first exemplary embodiment, a pixel size of one pixel PIX is relatively large, and length in the row direction is 630 μm while a length in the column direction is 630 μm as an example. In the first exemplary embodiment, the length in the row direction and the length in the column direction of one pixel PIX are identical to each other. That is, an aspect ratio (row direction length column direction length) of one pixel PIX is 1:1. The aspect ratio of one pixel PIX is not limited to 1:1. For example, the aspect ratio may be 1:3.

As described above, in liquid crystal display panel LCP of the first exemplary embodiment, the plurality of pixel electrodes PIT and the plurality of transistors TR are provided in one pixel PIX. As illustrated in FIGS. 3 and 4, in each pixel PIX, the plurality of pixel electrodes PIT and the plurality of transistors TR are arranged in the row direction (first direction). Specifically, seven pixel electrodes PIT are arranged at substantially equal intervals along the row direction. Seven transistors TR are arranged at substantially equal intervals along the row direction.

As illustrated in FIGS. 3 and 4, a plurality of slits are formed in each pixel electrode PIT, and each pixel electrode PIT includes a plurality of line electrodes PITL extending in the column direction (second direction). In the first exemplary embodiment, each pixel electrode PIT includes 11 line electrodes PITL. Ends in a longitudinal direction of 11 line electrodes PITL are connected by connection electrode PITC extending along the row direction in a vicinity of scanning line GL. All line electrodes PITL in each pixel electrode PIT are formed in parallel.

Each line electrode PITL has substantially the same width, and is formed into a substantial U-shape having a bent portion in a central portion. In each pixel electrode PIT, an interval (slit width) between two adjacent line electrodes PITL is kept constant. The intervals of all 11 line electrodes PITL are identical.

As illustrated in FIG. 4, in all seven pixel electrodes PIT, interval sp1 between two adjacent pixel electrodes PIT (that is, an interval between the line electrode in the last column of one pixel electrode PIT and the line electrodes in the first column of the other pixel electrode PIT) is equal to interval sp2 between the two adjacent line electrodes PITL in one pixel electrode PIT. As a result, in one pixel PIX, all the intervals between the line electrodes PITL (11×7=77 lines) are identical, and a line and space (L/S) of all line electrodes PITL is kept constant. Consequently, a difference in pixel capacitance $C_{PIX}$ can be decreased at each pixel electrode PIT. For example, all pixel capacitances $C_{PIX}$ at pixel electrodes PIT can be equalized.

Assuming that $C_{gs}$ is gate-source capacitance of transistor TR, $C_{PIX}/C_{gs}$ indicating the pixel capacitance ratio may be less than or equal to ±10% for all of the plurality of pixel electrodes PIT and the plurality of transistors TR in each pixel PIX. Preferably $C_{PIX}/C_{gs}$ may be identical for all of pixel electrodes PIT and transistors TR corresponding to pixel electrodes PIT.

Assuming that $W_{TFT}$ is a channel width of semiconductor layer SC of transistor TR, $C_{PIX}/W_{TFT}$ indicating the pixel capacitance ratio may be less than or equal to ±10% for all of the plurality of pixel electrodes PIT and the plurality of transistors TR in each pixel PIX. Preferably, $C_{PIX}/W_{TFT}$ may be identical for all of pixel electrodes PIT and transistors TR corresponding to pixel electrodes PIT.

In this way, when the pixel capacitance ratio ($C_{PIX}/C_{gs}$, $C_{PIX}/W_{TFT}$) between pixel electrode PIT and transistor TR corresponding to pixel electrode PIT falls within a certain range, pixel electrode PIT and transistor TR may be different from each other in the shape and the size. That is, a degree of freedom in designing pixel electrode PIT and transistor TR is improved by setting the pixel capacitance ratio within a certain range. Thus, the shape of at least one of the plurality of pixel electrodes PIT included in one pixel PIX may be different from that of other pixel electrodes PIT included in the pixel PIX. That is, the plurality of pixel electrodes PIT included in one pixel PIX may include pixel electrode PIT having the different shape.

In the first exemplary embodiment, seven pixel electrodes PIT have the same shape and the same size. Consequently, pixel capacitances $C_{PIX}$ of pixel electrodes PIT can easily be equalized. Preferably, the width of each pixel electrode PIT is less than or equal to 200 μm, more preferably less than or equal to 100 μm. Consequently, a pixel defect can be made inconspicuous even if the pixel defect is generated in one of the plurality of pixel electrodes PIT.

Seven transistors TR have the same shape and the same size. Consequently, gate-source capacitance $C_{gs}$ and channel width $W_{TFT}$ of each transistor TR can easily be equalized. Additionally, generation of an afterimage (DC afterimage) in the display image due to a DC voltage remaining in the pixel PIX can be prevented by equalizing the shapes and sizes of all seven transistors TR.

As illustrated in FIG. 3, video signal line SL (first video signal line SL1, second video signal line SL2) is formed along line electrode PITL of pixel electrode PIT. That is, each of first video signal line SL1 and second video signal line SL2 is formed into the substantial U-shape having the bent portion. First video signal line SL1 and second video signal line SL2 are formed in parallel to and adjacent to each other. Specifically, first video signal line SL1 and second video signal line SL2 are formed in parallel to each other. In the first exemplary embodiment, first video signal line SL1 and second video signal line SL2 each have the same constant width, but the present disclosure is not limited this configuration.

As illustrated in FIGS. 3 and 5, at least one of the plurality of line electrodes PITL in pixel electrode PIT exists between first video signal line SL1 and second video signal line SL2.

For example, assuming that first pixel electrode PIT1 is pixel electrode PIT of first pixel PIX1 (pixel PIX on the right side in FIG. 3) that is one of two pixels PIX adjacent to each other in the row direction, and assuming that second pixel electrode PIT2 is pixel electrode PIT of second pixel PIX2 (pixel PIX on the left side in FIG. 3) that is the other of two pixels PIX adjacent to each other in the row direction. Concerning second pixel electrode PIT2 closest to first pixel PIX1 among the plurality of second pixel electrodes PIT2 of second pixel PIX2, line electrode PITL closest to first pixel PIX1 among the plurality of line electrodes PITL constituting said second pixel electrode PIT2 exists between first video signal line SL1 and second video signal line SL2.

One of first video signal line SL1 and second video signal line SL2 overlaps pixel electrode PIT, and the other does not overlap pixel electrode PIT. In the first exemplary embodiment, as illustrated in FIG. 3, in planar view, first video signal line SL1 overlaps line electrode PITL of second pixel electrode PIT2 of second pixel PIX2, and second video signal line SL2 is located between first pixel electrode PIT1 of first pixel PIX1 and second pixel electrode PIT2 of second pixel PIX2.

Specifically, first video signal line SL1 overlaps line electrode PITL of second pixel electrode PIT2 closest to first pixel PIX1 among the plurality of second pixel electrodes PIT2 in second pixel PIX2. In the first exemplary embodiment, first video signal line SL1 overlaps second and third line electrodes PITL from the side of first pixel PIX1 among 11 line electrodes PITL in second pixel electrode PIT2 closest to first pixel PIX1 in second pixel PIX2. First line electrode PITL (that is, line electrode PITL closest to first pixel PIX1) from the side of first pixel PIX1 among 11 line electrodes PITL in second pixel electrode PIT2 closest to first pixel PIX1 is located between first video signal line SL1 and second video signal line SL2.

On the other hand, second video signal line SL2 is located between first pixel electrode PIT1 closest to second pixel PIX2 among the plurality of first pixel electrodes PIT1 in first pixel PIX1 and second pixel electrode PIT2 closest to first pixel PIX1 among the plurality of second pixel electrodes PIT2 in second pixel PIX2. Specifically, second video signal line SL2 is located between line electrode PITL closest to second pixel electrode PIT2 among 11 line electrodes PITL in first pixel electrode PIT1 of first pixel PIX1 and line electrode PITL closest to first pixel electrode PIT1 among 11 line electrodes PITL in second pixel electrode PIT2 of second pixel PIX2.

As illustrated in FIG. 4, lead line LDL that connects video signal line SL and the plurality of transistors TR in each pixel PIX is provided in order to supply the data voltage of video signal line SL to each of the plurality of transistors TR. Lead line LDL is formed in the same layer as source electrode S and drain electrode D. That is, lead line LDL, source electrode S, and drain electrode D are formed by patterning the same metal film.

Lead line LDL includes common lead line LDLC extending in the row direction from video signal line SL and a plurality of first individual lead lines LDL1 connected to common lead line LDLC and drain electrode D of each of the plurality of transistors TR in each pixel PIX.

Common lead line LDLC is extracted from video signal line SL. Common lead line LDLC is formed at a position overlapping opening OPN of common electrode MIT, and does not overlap scanning line GL in planar view. In the first exemplary embodiment, common lead line LDLC does not overlap any other conductive members. Consequently, parasitic capacitance generated between common lead line LDLC and the wiring such as scanning line GL can be reduced. Common lead line LDLC overlaps light shielding layer BM of second substrate SUB2.

First individual lead line LDL1 is formed according to the plurality of transistors TR in pixel PIX. In the first exemplary embodiment, seven transistors TR are provided in one pixel PIX, so that seven first individual lead lines LDL1 are also formed. First individual lead line LDL1 is formed so as to extend in the column direction from common lead line LDLC toward corresponding transistor TR.

A plurality of second individual lead lines LDL2 each of which connect the plurality of pixel electrodes PIT and source electrode S of transistors TR are provided in pixel PIX. Second individual lead line LDL2 is formed in the same layer as pixel electrode PIT. That is, second individual lead line LDL2 and pixel electrode PIT are formed by patterning the same transparent conductive film.

Second individual lead line LDL2 is formed according to the plurality of transistors TR in pixel PIX. In the first exemplary embodiment, seven transistors TR are provided in one pixel PIX, so that seven individual lead lines LDL2 are also formed. Second individual lead line LDL2 is formed so as to extend in the column direction from the pixel electrode PIT toward corresponding transistor TR. Specifically, second individual lead line LDL2 is extracted from a central portion of connection electrode PITC of pixel electrode PIT.

First individual lead line LDL1 and second individual lead line LDL2, which are connected to each transistor TR, can be used to repair pixel FIX when the pixel defect is generated in pixel PIX. The pixel defect is generated by a short circuit between pixel electrode PIT and common electrode MIT due to contamination of a conductive foreign matter or a short circuit between the electrodes of transistor TR. In the case that the pixel defect is generated, first individual lead line LDL1 and second individual lead line LDL2 are cut in order to separate abnormal pixel electrode PIT that is short-circuited to common electrode MIT or abnormal transistor TR in which the electrodes are short-circuited to each other from the normal pixel electrode or normal transistor TR.

For example, in the case that pixel electrode PIT and common electrode MIT are short-circuited to each other, the abnormal pixel electrode PIT short-circuited to common electrode MIT is specified by a defect inspection of pixel PIX, and a part of first individual lead line LDL1 connected to transistor TR corresponding to short-circuited pixel electrode PIT is cut with a laser beam. Subsequently, a part of second individual lead line LDL2 connected to short-circuited pixel electrode PIT is cut with the laser beam. Consequently, transistor TR connected to short-circuited pixel electrode PIT can be brought into an electrically floating state (floating state), and short-circuited pixel electrode PIT can be separated from normal pixel electrode PIT.

Similarly, in the case that the electrodes of transistor TR are short-circuited, abnormal transistor TR in which the electrodes are short-circuited to each other is specified by the defect inspection of pixel PIX, and a part of first individual lead line LDL1 connected to abnormal transistor TR is cut with the laser beam. Subsequently, a part of second individual lead line LDL2 connected to pixel electrode PIT corresponding to abnormal transistor TR is cut with the laser beam. Consequently, abnormal transistor TR is brought into the electrically floating state, and abnormal transistor TR is separated from pixel electrode PIT and another transistor TR, which are connected to abnormal transistor TR.

In this way, abnormal pixel electrode PIT or abnormal transistor TR can individually be separated by individually cutting a part of first individual lead line LDL1 or a part of second individual lead line LDL2.

Preferably, at least a part of first individual lead line LDL1 does not overlap another conductive member in planar view. Specifically, a root on the side of common lead line LDLC in first individual lead line LDL1 does not overlap any other conductive members.

At least a part of second individual lead line LDL2 may not overlap another conductive member in planar view. Specifically, the root on the side of pixel electrode PIT in second individual lead line LDL2 does not overlap any other conductive members.

Consequently, other conductive members can be avoided being cut with the laser beam when the root of first individual lead line LDL1 or second individual lead line LDL2 is cut with the laser beam in order to separate abnormal transistor TR or abnormal pixel electrode PIT.

A sectional structure of liquid crystal display panel LCP will mainly be described below.

As illustrated in FIGS. 5 to 7, liquid crystal display panel LCP includes first substrate SUB1, second substrate SUB2 opposed to first substrate SUB1, and liquid crystal layer LCL disposed between first substrate SUB1 and second substrate SUB2. In the first exemplary embodiment, first substrate SUB1 is located on the side of backlight BL, and second substrate SUB2 is located on the observer side. Liquid crystal layer LCL is sealed between first substrate SUB1 and second substrate SUB2.

First substrate SUB1 is a TFT substrate including a TFT as transistor TR. Not only transistor TR but also various wirings such as video signal line SL and scanning line GL, an interlayer insulator that insulates these wirings, pixel electrode PIT, common electrode MIT, and alignment film PI are provided in first substrate SUB1. These are formed on first transparent base material TSUB1. For example, first transparent base material TSUB1 is a transparent substrate such as a glass substrate.

Transistor TR formed on first transparent base material TSUB1 is constructed with gate electrode G, source electrode S, drain electrode D, and semiconductor layer SC that becomes a channel layer. In the first exemplary embodiment, transistor TR is a TFT having a bottom gate structure, and includes gate electrode G formed on first transparent base material TSUB1, gate insulating layer GI formed on gate electrode G, and semiconductor layer SC formed above gate electrode G with gate insulating layer GI interposed therebetween. Source electrode S and drain electrode D are formed on semiconductor layer SC.

Gate insulating layer GI is not limited to the single layer, but may be constructed with at least two layers.

As illustrated in FIGS. 5 to 7, scanning line GL and video signal line SL are formed on first substrate SUB1. Scanning line GL is formed in the same layer as gate electrode G. That is, scanning line GL and gate electrode G are formed by patterning the same metal film. On the other hand, video signal line SL is formed in the same layer as source electrode S and drain electrode D. That is, video signal line SL, source electrode S, and drain electrode D are formed by patterning the same metal film. As illustrated in FIG. 4, in the first exemplary embodiment, drain electrode D of transistor TR is connected to video signal line SL, and source electrode S of transistor TR is connected to pixel electrode PIT.

As illustrated in FIGS. 4 and 7, light shielding body SLD is provided on first substrate SUB1. As illustrated in FIG. 4, light shielding body SLD is formed so as to surround transistor TR in planar view. As illustrated in FIG. 7, in the first exemplary embodiment, light shielding body SLD is formed in the same layer as semiconductor layer SC. That is, light shielding body SLD and semiconductor layer SC are formed by patterning the same semiconductor film. Thus, light shielding body SLD functions as a light absorption layer because light shielding body SLD is made of an amorphous silicon film absorbing the light. That is, light shielding body SLD shields the light by absorbing the light. Light shielding body SLD is provided around transistor TR in this way, which allows a characteristic of transistor TR to be prevented from being changed by incidence of the light.

As illustrated in FIGS. 5 to 7, first insulator PAS is formed on first transparent base material TSUB1 so as to cover transistor TR, scanning line GL (first scanning line GL1, second scanning line GL2), and video signal line SL (first video signal line SL1, second video signal line SL2). First insulator PAS is constructed with an inorganic insulator (for example, 200 nm) made of an inorganic material such as a silicon nitride film. For example, first insulator PAS that is the inorganic insulator can be formed by a CVD method.

Second insulator OPAS is formed so as to cover first insulator PAS. In the first exemplary embodiment, a thickness of second insulator OPAS is larger than a thickness of first insulator PAS. Specifically, the thickness of second insulator OPAS is greater than or equal to 10 times the thickness of first insulator PAS. Consequently, a distance in the thickness direction between the wiring such as scanning line GL and video signal line SL and common electrode MIT can be increased, so that the parasitic capacitance generated by the wiring such as scanning line GL and video signal line SL and common electrode MIT can be reduced. Additionally, by thickening second insulator OPAS, a difference in irregularity caused by forming transistor TR, scanning line GL, and video signal line SL, of the TFT layer can be reduced to planarize the TFT layer. Consequently, second insulator OPAS in which the surface is planarized can be formed, so that common electrode MIT immediately above second insulator OPAS can be formed into a planar shape.

In the first exemplary embodiment, second insulator OPAS is constructed with an organic insulator made of an organic material containing carbon. Second insulator OPAS that is the organic insulator can be formed by, for example, applying and hardening a liquid organic material. Consequently, second insulator OPAS can easily be thickened, so that the surface of second insulator OPAS can easily be planarized over all pixels PIX. That is, second insulator OPAS functions as a planarization layer.

Common electrode MIT and pixel electrode PIT are formed on the first substrate SUB1. Specifically, common electrode MIT and pixel electrode PIT are laminated so as to be opposed to each other with a third insulator UPS interposed therebetween.

In the first exemplary embodiment, common electrode MIT is formed on second insulator OPAS. Third insulator UPS is formed so as to cover common electrode MIT, and pixel electrode PIT is formed into a predetermined shape on third insulator UPS. Common electrode MIT and pixel electrode PIT are transparent electrodes made of a transparent metal oxide such as Indium Tin Oxide (ITO). Third insulator UPS is made of an inorganic insulator (for example, 600 nm) such as a silicon nitride film. Third insulator UPS that is the inorganic insulator can be formed by, for example, a CVD method.

As described above, common electrode MIT is a planar solid electrode formed over all pixels PIX. Consequently, the wirings such as scanning line GL (first scanning line GL1, second scanning line GL2) and video signal line SL (first video signal line SL1, second video signal line SL2) are covered with common electrode MIT, so that the electric field generated by the wirings such as scanning line GL and video signal line SL can be shielded by common electrode MIT. That is, the electric field generated in the TFT layer can be shielded by common electrode MIT. Thus, the degree of freedom in designing the shape and size of pixel electrode PIT formed on common electrode MIT is improved, so that light transmittance and an aperture ratio of pixel PIX can easily be improved.

Figure 8:
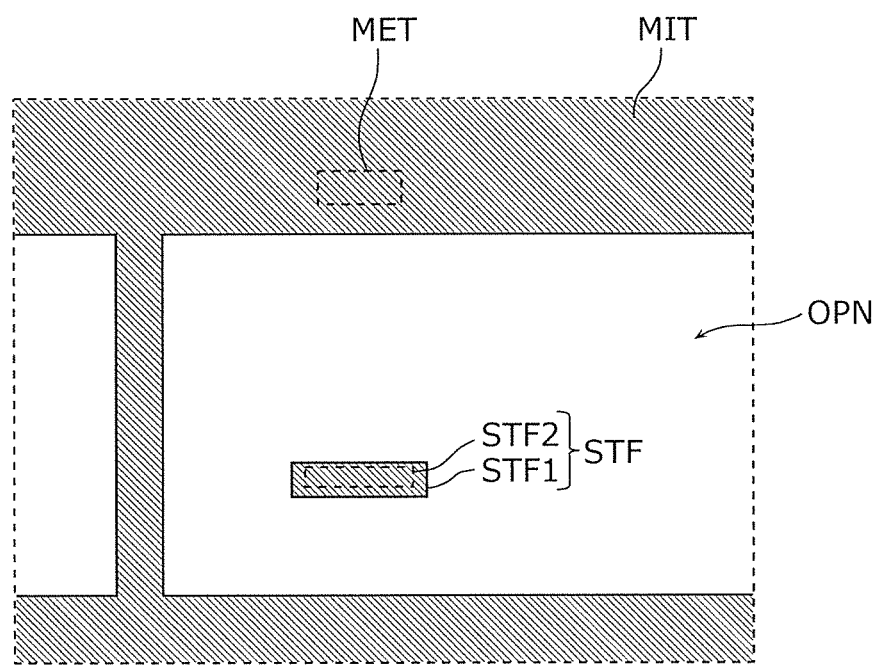
FIG. 8 is a view illustrating a shape of a common electrode in the periphery of the transistor in the liquid crystal display panel of the first exemplary embodiment.

Common electrode MIT is the thin-film, planar solid electrode. Opening OPN extending in the row direction is formed in common electrode MIT on the scanning line GL as illustrated in FIGS. 4 and 8. FIG. 8 is a view illustrating the shape of common electrode MIT around transistor TR, and corresponds to the region surrounded by a broken line in FIG. 4. In FIG. 8, for convenience, common electrode MIT is hatched in order to indicate a location where common electrode MIT exists.

As described above, the plurality of pixel electrodes PIT are provided in one pixel PIX, and each pixel electrode PIT includes the plurality of line electrodes PITL extending in the column direction. In each pixel PIX, pixel capacitor $C_{PIX}$ is generated by pixel electrode PIT and common electrode MIT. As illustrated in FIGS. 6 and 7, contact hole CH penetrating insulating layer IL having a three-layer structure of first insulator PAS, second insulator OPAS, and third insulator UPS is made in opening OPN of common electrode MIT.

Insulating layer IL having the three-layer structure of first insulator PAS, second insulator OPAS, and third insulator UPS is formed over all pixels PIX, and provided between the plurality of transistors TR and the plurality of pixel electrodes PIT in each pixel PIX. Thus, in each pixel PIX, contact holes CH are made as many as the numbers of transistors TR and pixel electrodes PIT in insulating layer IL.

In each pixel PIX, the plurality of transistors TR and the plurality of pixel electrodes PIT are electrically connected to each other through the plurality of contact holes CH, respectively. Specifically, each pixel electrode PIT is connected to source electrode S of transistor TR through contact hole CH.

As illustrated in FIGS. 4 and 7, in the first exemplary embodiment, contact hole CH includes contact portion CH1 that is a portion where pixel electrode PIT is electrically connected to source electrode S of transistor TR and extending portion CH2 that is a portion extending from contact portion CH1. Specifically, in contact portion CH1, second individual lead line LDL2 extracted from pixel electrode PIT is connected to source electrode S of transistor TR.

Figure 9:
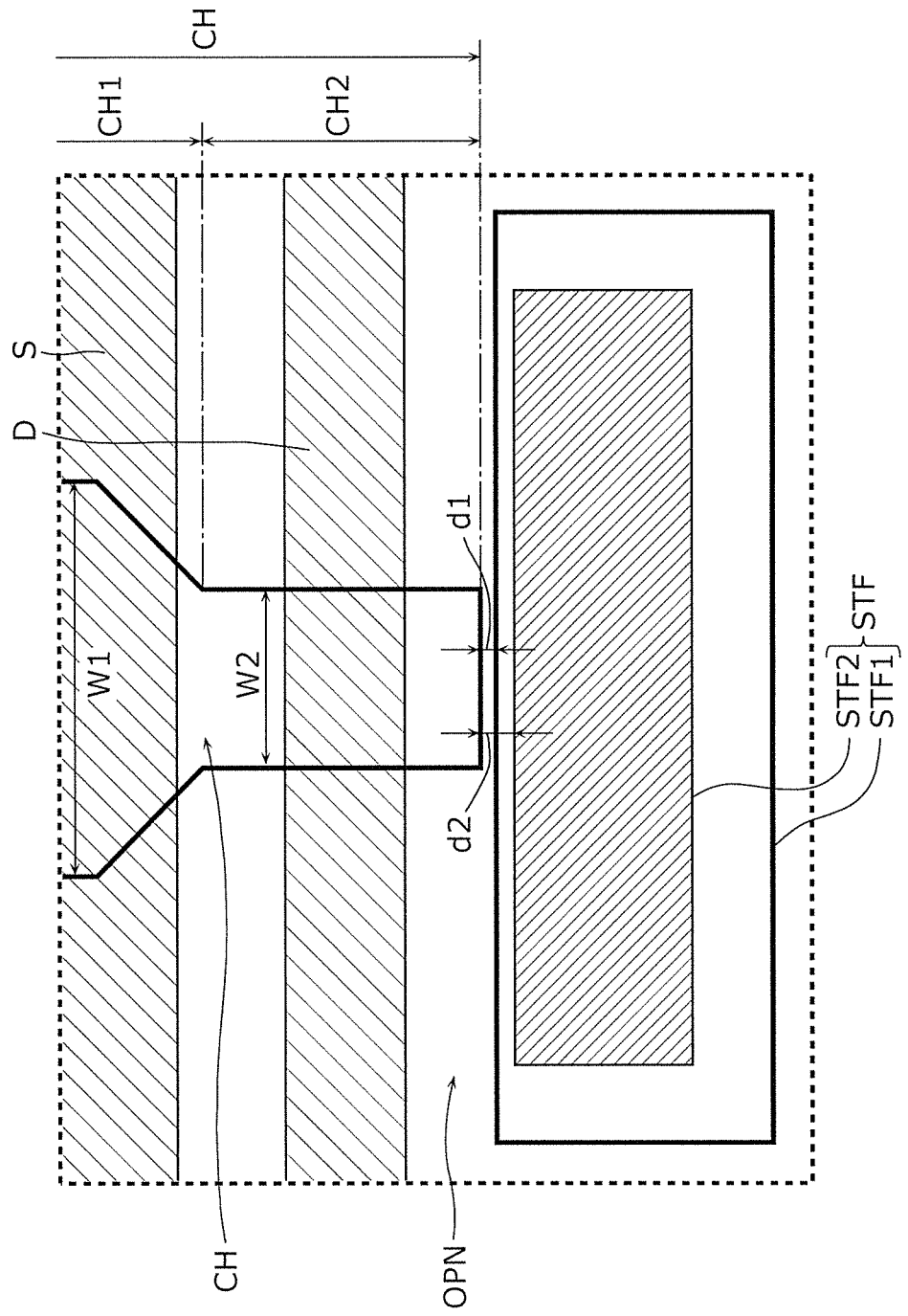
FIG. 9 is an enlarged view illustrating a region IX surrounded by a broken line in FIG. 4.

Extending portion CH2 does not overlap pixel electrode PIT in planar view, but extends in a direction of the opposite side to the pixel electrode PIT in pixel PIX in which contact hole CH is made. As illustrated in FIG. 9, width W2 of extending portion CH2 is narrower than width W1 of contact portion CH1. FIG. 9 is an enlarged view illustrating region IX surrounded by a broken line in FIG. 4. However, semiconductor layer SC, the layer formed in the same layer as semiconductor layer SC, and pixel electrode PIT are not illustrated in FIG. 9.

As illustrated in FIGS. 4 and 9, in the first exemplary embodiment, entire contact hole CH is made in opening OPN of common electrode MIT. For this reason, not only contact portion CH1 does not overlap common electrode MIT, but also extending portion CH2 does not overlap common electrode MIT. Extending portion CH2 overlaps drain electrode D of transistor TR in planar view.

As illustrated in FIGS. 3 to 5, common line (vertical common) CMT extending in the column direction is provided at a boundary between two pixels PIX adjacent to each other in the row direction. Common line CMT is provided immediately above common electrode MIT. That is, common line CMT is laminated on common electrode MIT while contacting with common electrode MIT. For example, common line CMT is constructed with a metal film made of a copper film (for example, 300 nm). In this way, a time constant of common electrode MIT can be decreased by laminating common line CMT made of the metal film on common electrode MIT.

As illustrated in FIG. 3, common line CMT is formed along video signal line SL. That is, common line CMT is formed into a substantial U-shape having a bent portion. Common line CMT overlaps first video signal line SL1 or second video signal line SL2 in planar view. Specifically, common line CMT overlaps first video signal line SL1.

The width of common line CMT is narrower than the width of first video signal line SL1, and common line CMT is formed so as not to protrude from first video signal line SL1 in planar view. However, the present disclosure is not limited to this configuration. For example, in order to further decrease the time constant of common electrode MIT, the width of common line CMT may be increased such that common line CMT extends over first video signal line SL1 and second video signal line SL2.

As illustrated in FIGS. 4 and 7, metal piece MET is provided between each of the plurality of pixel electrodes PIT and common electrode MIT in the thickness direction. Metal piece MET is formed in the same layer as common line CMT. That is, metal piece MET and common line CMT are formed by patterning the same metal film. Because metal piece MET is located in the same layer as common line CMT, metal piece MET is formed immediately above common electrode MIT. As illustrated in FIG. 7, metal piece MET is opposed to pixel electrode PIT with third insulator UPS interposed therebetween in sectional view. Specifically, metal piece MET is formed in each pixel electrode PIT, and opposed to connection electrode PITC of each pixel electrode PIT in the thickness direction. That is, metal piece MET is formed below pixel electrode PIT.

Metal piece MET can be used to repair pixel PIX by making a black point in the case that the pixel defect is generated in pixel PIX. For example, in the case that the pixel defect is generated due to the short circuit between the electrodes of transistor TR, as described above, a part of first individual lead line LDL1 connected to abnormal transistor TR is cut with the laser beam, and a part of second individual lead line LDL2 connected to pixel electrode PIT corresponding to abnormal transistor TR is cut with the laser beam. Consequently, abnormal transistor TR is brought into the electrically floating state, and abnormal transistor TR can be separated. In this case, pixel electrode PIT also becomes the electrically floating state, and the image quality is degraded when an unintended signal (charge) is applied to pixel electrode PIT in the electrically floating state. Thus, preferably pixel electrode PIT and common electrode MIT are intentionally short-circuited such that the unintended signal is not applied to pixel electrode PIT in the electrically floating state. At this point, pixel electrode PIT and common electrode MIT can easily be short-circuited using colored metal piece MET. Specifically, abnormal transistor TR is specified by the defect inspection, and the formation region of metal piece MET corresponding to pixel electrode PIT connected to abnormal transistor TR is irradiated with the laser beam. Consequently, pixel electrode PIT located above metal piece MET can be dropped on common electrode MIT, so that pixel electrode PIT and common electrode MIT can easily be short-circuited.

As illustrated in FIGS. 5 to 7, alignment film PI is formed on pixel electrode PIT. Alignment film PI is formed over all pixels PIX so as to cover pixel electrode PIT above first transparent base material TSUB1. Alignment film PI contacts with liquid crystal layer LCL, and controls an initial alignment angle of the liquid crystal molecules of liquid crystal layer LCL. In the first exemplary embodiment, alignment film PI is subjected to a rubbing treatment in order to align initial alignment angles of the liquid crystal molecules in a certain direction.

As illustrated in FIGS. 7 and 9, island-shaped laminated film STF is formed on insulating layer IL in the vicinity of contact hole CH connecting pixel electrode PIT and source electrode S of transistor TR.

In this way, island-like laminated film STF is formed on insulating layer IL in the vicinity of contact hole CH, which allows a liquid alignment film material to be wetted and spread by laminated film STF when the alignment film material is applied onto insulating layer IL. Consequently, the alignment film material can be prevented from remaining at an edge of contact hole CH in insulating layer IL, and the alignment film material can easily be introduced into contact hole CH. Thus, alignment film PI having the uniform film thickness can be formed on insulating layer IL, and alignment film PI can be formed even in contact hole CH. As a result, degradation of the image quality can be prevented.

In the first exemplary embodiment, laminated film STF is formed on second insulator OPAS in the vicinity of a leading end of extending portion CH2 of contact hole CH. Specifically, laminated film STF is formed between second insulator OPAS and third insulator UPS.

As illustrated in FIG. 4, laminated film STF is formed above scanning line GL. That is, laminated film STF overlaps scanning line GL in planar view. Laminated films STF are formed as many as the number of transistors TR. In the first exemplary embodiment, seven laminated films STF are formed. Seven laminated films STF are formed in line along scanning line GL. First individual lead line LDL1 of lead line LDL connecting video signal line SL and transistor TR is provided between two adjacent laminated films STF.

As illustrated in FIG. 7, each laminated film STF includes first film STF1 and second film STF2 laminated on first film STF1. In the first exemplary embodiment, laminated film STF has a two-layer structure of first film STF1 and second film STF2.

First film STF1 is formed in the same layer as common electrode MIT. That is, first film STF1 and common electrode MIT are formed by patterning the same transparent conductive film. Thus, in the first exemplary embodiment, first film STF1 is made of the same ITO film as common electrode MIT. As illustrated in FIG. 4, as an example, first film STF1 is an island-shaped film provided with a space from common electrode MIT. In planar view, first film STF 1 has a rectangular shape in which the row direction is set to the longitudinal direction.

Second film STF2 is formed in the same layer as common line CMT. That is, second film STF2 and common line CMT are formed by patterning the same metal film. Thus, in the first exemplary embodiment, second film STF2 is made of the same copper film as common line CMT. As illustrated in FIG. 4, as an example, second film STF2 is an island-like film provided with a space from common line CMT. In planar view, second film STF2 has a rectangular shape in which the row direction is set to the longitudinal direction.

Laminated film STF is made of the same material as common electrode MIT and common line CMT, and laminated film STF is in the electrically floating state because laminated film STF is formed into the island shape. Consequently, the generation of the parasitic capacitance between the wirings can be prevented as compared with the case that laminated film STF is formed by routing a part of common line CMT having a long distance from contact hole CH.

As illustrated in FIGS. 8 and 9, in planar view, first film STF1 of the lower layer is larger than second film STF2 of the upper layer. Consequently, an end of laminated film STF is formed stepwise. That is, as illustrated in FIG. 7, first film STF1 has a protrusion (step-wise portion) STP in which the end of first film STF1 protrudes from the end of second film STF2. Protrusion STP is provided on the side of contact hole CH of first film STF1. Protrusion STP is also provided on the opposite side to contact hole CH of first film STF1. That is, first film STF1 includes protrusion STP at both ends of the end on the side of contact hole CH and the end on the opposite side to contact hole CH. In the first exemplary embodiment, the entire periphery at the end of first film STF1 protrudes from the end of second film STF2, and the entire peripheral end of first film STF1 constitutes protrusion STP. That is, the entire peripheral edge of laminated film STF is formed stepwise.

As illustrated in FIG. 9, distance d1 (a protrusion amount of second insulator OPAS from the end of first film STF1) between the end of first film STF1 and extending portion CH2 is set to 0.5 and distance d2 (a protrusion amount of second insulator OPAS from the end of second film STF2) between the end of second film STF2 and extending portion CH2 is set to 1.0 µm.

As illustrated in FIGS. 5 to 7, observer-side second substrate SUB2 is a counter substrate opposed to first substrate SUB1. Second substrate SUB2 includes second transparent base material TSUB2 and light shielding layer BM formed on second transparent base material TSUB2. Similarly to first transparent base material TSUB1, for example, second transparent base material TSUB2 is a transparent substrate such as a glass substrate.

Light shielding layer BM is a black layer. For example, light shielding layer BM is made of carbon black. Light shielding layer BM is formed on the surface on the side of liquid crystal layer LCL of second transparent base material TSUB2. In the first exemplary embodiment, light shielding layer BM is formed at each boundary between two pixels PIX adjacent to each other in the column direction. Specifically, as illustrated in FIGS. 4 and 6, a plurality of light shielding layers BM are formed so as to cover each scanning line GL on first substrate SUB1. That is, each light shielding layer BM overlaps each scanning line GL in planar view. Each light shielding layer BM has a stripe shape, and is formed into a line shape along the row direction with a constant width.

The width of light shielding layer BM is larger than the width of scanning line GL, and scanning line GL is formed so as not to protrude from light shielding layer BM. Light shielding layer BM also covers lead line LDL formed in each pixel PIX.

Light shielding layer BM is formed, which allows the light such as natural light to be shielded. Consequently, the degradation of the image quality due reflection of the light such as natural light from the surfaces of lead line LDL and scanning line GL can be prevented.

In the first exemplary embodiment, light shielding layer BM is not formed at the boundary between two pixels PIX adjacent to each other in the row direction. That is, light shielding layer BM is not formed along the extending direction of first video signal line SL1 and second video signal line SL2. Thus, line electrode PITL existing between first video signal line SL1 and second video signal line SL2 is not covered with light shielding layer BM.

In the case that liquid crystal display panel LCP displays the color image, second substrate SUB2 constitutes a color filter substrate including a color filter. In this case, for example, one of a red color filter, a blue color filter, and a green color filter is formed according to each pixel PIX. The color filter is formed in the region (that is, opening OPN of light shielding layer BM) between light shielding layers BM. On the other hand, in the case that liquid crystal display panel LCP displays the monochrome image, the color filter is not formed on second substrate SUB2.

Figure 10:
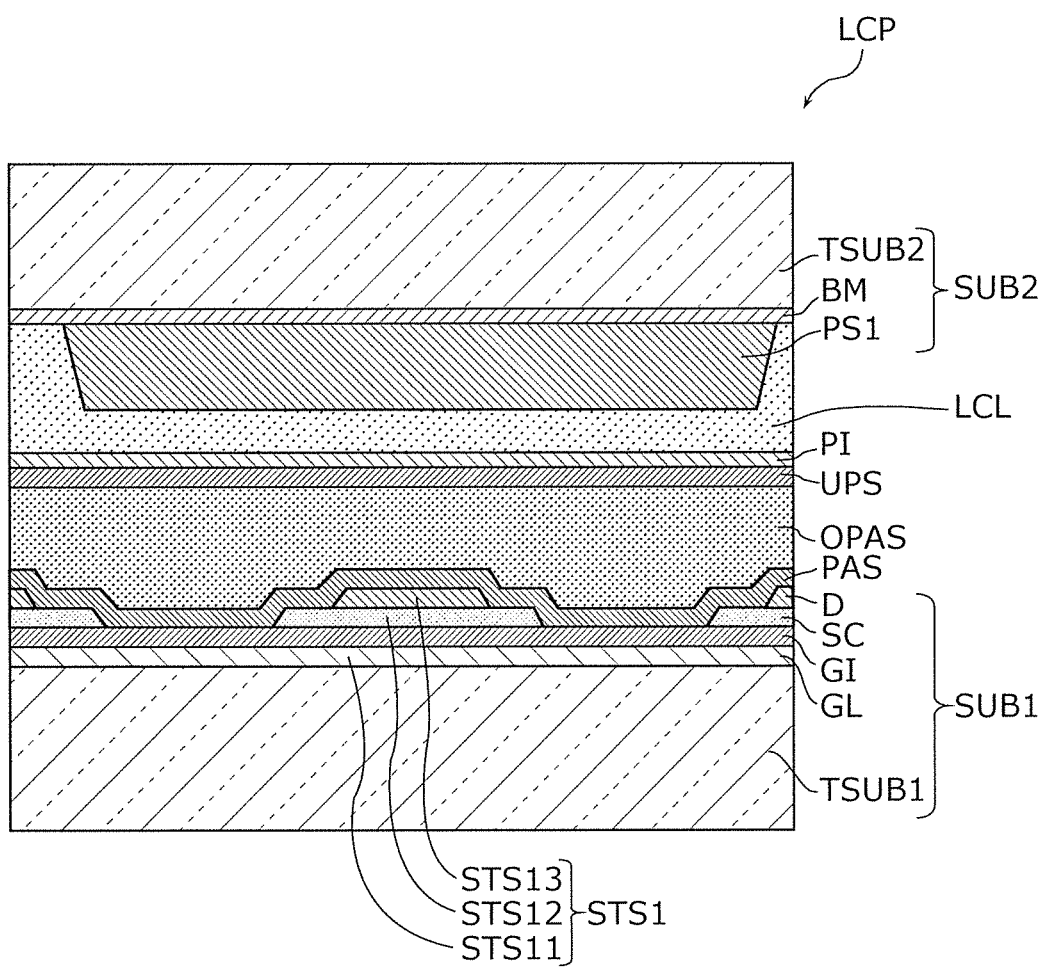
FIG. 10 is a sectional view taken along a line X-X in FIG. 4 in the liquid crystal display panel of the first exemplary embodiment.

As illustrated in FIG. 4, first spacer PS1 and second spacer PS2 are provided in second substrate SUB2. First spacer PS1 and second spacer PS2 and first laminated structure STS1 and second laminated structure STS2, which are opposed to first spacer PS1 and second spacer PS2, will be described below with reference to FIGS. 10 and 11. FIG. 10 is a sectional view taken along line X-X in FIG. 4 in liquid crystal display panel LCP of the first exemplary embodiment, and FIG. 11 is a sectional view taken along line XI-XI in FIG. 4 in liquid crystal display panel LCP.

Figure 11:
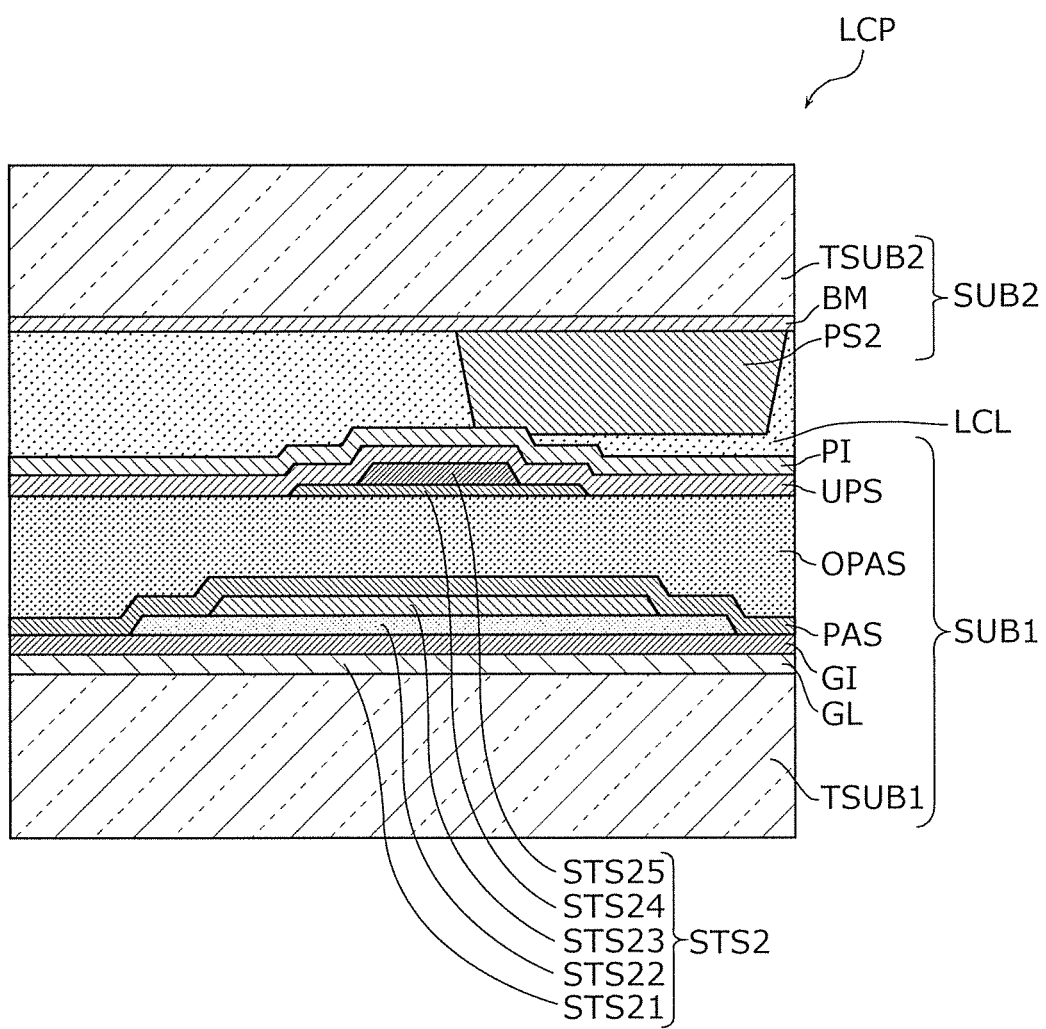
FIG. 11 is a sectional view taken along a line XI-XI in FIG. 4 in the liquid crystal display panel of the first exemplary embodiment.

As illustrated in FIGS. 10 and 11, first spacer PS1 and second spacer PS2 are formed so as to protrude from second substrate SUB2 toward first substrate SUB1. First spacer PS1 and second spacer PS2 are a columnar spacer that maintains an interval (cell gap) between first substrate SUB1 and second substrate SUB2. In other words, the thickness of liquid crystal layer LCL can be kept constant by first spacer PS1 and second spacer PS2. In the first exemplary embodiment, first spacer PS1 and second spacer PS2 have a cylindrical trapezoidal shape, and the upper ends and the lower ends of first spacer PS1 and second spacer PS2 have a circular shape in planar view.

First spacer PS1 and second spacer PS2 are made of a resin material such as an acrylic resin, and can elastically be deformed. For example, first spacer PS1 and second spacer PS2 can be formed by photolithography.

In the first exemplary embodiment, a height of first spacer PS1 is different from a height of second spacer PS2. Specifically, the height of second spacer PS2 is higher than the height of first spacer PS1. As illustrated in FIG. 4, an area at the leading end of first spacer PS1 is larger than an area at the leading end of second spacer PS2 in planar view. In this way, first spacer PS1 and second spacer PS2 having different heights and shapes can be formed by a halftone mask or a two-time mask.

As illustrated in FIG. 11, second spacer PS2 is a main spacer that defines the interval between first substrate SUB1 and second substrate SUB2, and the leading end of second spacer PS2 contacts with first substrate SUB1. Second spacer PS2 always supports first substrate SUB1 and second substrate SUB2, and the leading end of second spacer PS2 contacts with first substrate SUB1 even if pressing force is not applied in the thickness direction of liquid crystal display panel LCP. In the first exemplary embodiment, the leading end of second spacer PS2 contacts with alignment film P1 that is the uppermost layer of first substrate SUB1. Second spacer PS2 is elastically deformed, so that the leading end of second spacer PS2 can be deformed by following the irregularity of the surface of first substrate SUB1 as illustrated in FIG. 11 even if a cell gap fluctuation is generated due to the existence of the irregularity on the surface of first substrate SUB1.

On the other hand, as illustrated in FIG. 10, first spacer PS1 is a sub-spacer, and the leading end of first spacer PS1 does not contact with first substrate SUB1 when the pressing force is not applied in the thickness direction of liquid crystal display panel LCP, but the leading end of first spacer PS1 contacts with first substrate SUB1 when the pressing force is applied in the thickness direction of liquid crystal display panel LCP. Consequently, even if lateral slippage is generated in second spacer PS2 due to a manufacturing process or a change in ambient temperature, or even if pressing force is applied in the thickness direction of liquid crystal display panel LCP, first substrate SUB1 and second substrate SUB2 are supplementally supported, so that the interval between first substrate SUB1 and second substrate SUB2 can easily be kept constant. First spacer PS1 can also be elastically deformed. Thus, even if the irregularity exists on the surface of the first substrate SUB1 to generate the cell gap fluctuation, the leading end of first spacer PS1 can be deformed by following the irregularity of the surface of first substrate SUB1 when first spacer PS1 comes into contact with first substrate SUB1.

The plurality of first spacers PS1 and the plurality of second spacers PS2 are arranged all over the plurality of pixels PIX in order to keep the interval between first substrate SUB1 and second substrate SUB2 constant over the entire region of the plurality of pixels PIX. In the first exemplary embodiment, when all the pixels are divided into a plurality of blocks with the plurality of pixels PIX as one block, first spacer PS1 and second spacer PS2 are arranged in each block with one block as a repeating unit. Specifically, several second spacers PS2 (main spacers) are arranged per block, and a plurality of first spacers PS1 (sub-spacers) are arranged in each pixel PIX. As an example, assuming that 3×2 pixels are one block, as illustrated in FIG. 4, four second spacers PS2 are arranged in one block, and six first spacers PS1 (36 first spacers per block) are provided in each pixel PIX.

As illustrated in FIG. 4, first spacer PS1 and second spacer PS2 are provided at boundary between two pixels PIX adjacent to each other in the column direction. Specifically, first spacer PS1 and second spacer PS2 are formed on light shielding layer BM. That is, first spacer PS1 and second spacer PS2 overlap light shielding layer BM and scanning line GL in planar view.

First spacer PS1 is located between two adjacent transistors out of the plurality of transistors TR in each pixel PIX. In the first exemplary embodiment, a part of first spacer PS1 overlaps a part of two adjacent transistors TR in planar view, but first spacer PS1 may not overlap two adjacent transistors TR.

Second spacer PS2 overlaps video signal line SL in planar view. Specifically, second spacer PS2 overlaps first video signal line SL1 out of first video signal line SL1 and second video signal line SL2. Second spacer PS2 also overlaps common line CMT.

As illustrated in FIG. 10, first laminated structure STS1 is provided on first substrate SUB1. First laminated structure STS1 is provided at a position opposed to first spacer PS1 provided on second substrate SUB2. First laminated structure STS1 functions as a base of first spacer PS1.

First laminated structure STS1 is formed by the members constituting first substrate SUB1. In the first exemplary embodiment, first laminated structure STS 1 is formed by the members constituting transistor TR, and includes first film STS11 formed in the same layer as gate electrode G of transistor TR, second film STS12 formed in the same layer as one of semiconductor layer SC and the source-drain electrode, and third film STS13 formed in the same layer as the other of semiconductor layer SC and the source-drain electrode. In the first exemplary embodiment, first film STS11, second film STS12, and third film STS13 are laminated in this order from the bottom to the top.

Specifically, first laminated structure STS1 is constructed with a three-layer structure of first film STS11 of the lowermost layer formed in the same layer as gate electrode G, second film STS12 of the intermediate layer formed in the same layer as the semiconductor layer SC, and third film STS13 of the uppermost layer formed in the same layer as source electrode S and drain electrode D.

As illustrated in FIG. 11, second laminated structure STS2 is provided on first substrate SUB1. Second laminated structure STS2 is provided at a position opposed to second spacer PS2 provided on second substrate SUB2. Second laminated structure STS2 functions as the base of second spacer PS2.

Second laminated structure STS2 is formed by the members (in the first exemplary embodiment, the members constituting transistor TR) constituting first substrate SUB1 similarly to first laminated structure STS1, and second laminated structure STS2 has a structure in which the wiring are further laminated on the same laminated structure as the laminated structure of first laminated structure STS1. In the first exemplary embodiment, second laminated structure STS 2 has a structure in which common line CMT is laminated as the wiring on the same laminated structure as the laminated structure of first laminated structure STS1.

Specifically, second laminated structure STS2 includes first film STS21 formed in the same layer as gate electrode G of transistor TR, second film STS22 formed in the same layer as one of semiconductor layer SC and source-drain electrode, and third film STS23 formed in the same layer as the other of semiconductor layer SC and the source-drain electrode. Second laminated structure STS2 further includes fourth film STS24 formed in the same layer as common electrode MIT and fifth film STS25 formed in the same layer as common line CMT. In the first exemplary embodiment, first film STS21, second film STS22, third film STS23, fourth film STS24, and fifth film STS25 are laminated in this order from the bottom to the top.

More specifically, second laminated structure STS 2 includes first film STS21 of the lowermost layer formed in the same layer as gate electrode G, second film STS22 of a first intermediate layer formed in the same layer as semiconductor layer SC, third film STS23 of a second intermediate layer formed in the same layer as source electrode S and drain electrode D, and fourth film STS24 of a third intermediate layer that is a part of common electrode MIT, and fifth film STS25 of the uppermost layer that is a part of common line CMT.

In second laminated structure STS2, one of fourth film STS24 and fifth STS25 may be provided. Fourth film STS24 may be separated from common electrode MIT, and fifth film STS25 may be separated from common line CMT.

The film located in the same layer as common electrode MIT and the film located in the same layer as common line CMT are not provided in first laminated structure STS1. That is, the height of second laminated structure STS2 is higher than that of first laminated structure STS1 by fourth film STS24 and fifth film STS25.

A pair of polarizing plates (not illustrated) is bonded to liquid crystal display panel LCP having the above configuration. For example, one of a pair of polarizing plates is formed on the outer surface of first substrate SUB 1, and the other of the pair of polarizing plates is formed on the outer surface of second substrate SUB 2. The pair of polarizing plates is disposed such that the polarization directions of polarizing plates are orthogonal to each other. A wave plate may be bonded to the pair of polarizing plates.

As described above, according to liquid crystal display panel LCP of the first exemplary embodiment, as illustrated in FIG. 4, a pair of first video signal line SL1 and second video signal line SL2 is provided at each boundary between two pixels PIX adjacent to each other in the row direction, and at least part of pixel electrode PIT exists between first video signal line SL1 and second video signal line SL2. Specifically, at least one of the plurality of line electrodes PITL in the pixel electrode PIT exists between first video signal line SL1 and second video signal line SL2.

A degree of freedom in designing pixel electrode PIT is increased by disposing pixel electrode PIT using a space between first video signal line SL1 and second video signal line SL2 in this way. Consequently, desired pixel capacitance $C_{PIX}$ is easily obtained, so that the image quality can be improved.

In particular, in the first exemplary embodiment, the plurality of pixel electrodes PIT and the plurality of transistors TR are formed in one pixel PIX. In this case, there is a possibility that pixel electrode PIT having pixel capacitance $C_{PIX}$ different from that of other pixel electrodes PIT exists when pixel electrode PIT having the different number of line electrodes PITL is included in the plurality of pixel electrodes PIT. However, when line electrode PITL is disposed using the space between first video signal line SL1 and second video signal line SL2, the difference in pixel capacitance $C_{PIX}$ generated by the line electrode PITL can be decreased for all pixel electrodes PIT. For example, pixel capacitances $C_{PIX}$ of all pixel electrodes PIT can easily be equalized. The use of line electrode PITL formed between first video signal line SL1 and second video signal line SL2 can finely adjust pixel capacitance $C_{PIX}$ of end pixel electrode PIT that tends to be distorted among the plurality of pixel electrodes PIT.

Moreover, even if one of the plurality of pixel electrodes PIT in each pixel PIX is short-circuited to common electrode MIT, pixel electrodes PIT except for the short-circuited pixel electrode PIT function normally as usual by forming the plurality of pixel electrodes PIT in one pixel PIX. Consequently, even if the pixel PIX includes the pixel defect (black point defect) due to the short circuit between pixel electrode PIT and common electrode MIT, liquid crystal layer LCL can be controlled using normal pixel electrode PIT that is not short-circuited. As compared with the case that entire pixel PIX becomes the black point, only a part of the inside of one pixel PIX becomes the black point, so that the black point defect can be made inconspicuous. As described above, even if the pixel defect due to the short circuit between pixel electrode PIT and common electrode MIT exists in one pixel PIX, the desired image can be displayed without making the black point conspicuous.

Even if one of the plurality of transistors TR in one pixel PIX is not normally operate and is in the abnormal state, other transistors TR except for abnormal transistor TR function normally as usual by forming the plurality of transistors TR in pixel PIX. Consequently, even if pixel PIX includes the pixel defect (bright point defect) due to abnormal transistor TR, liquid crystal layer LCL can be controlled using another normal transistor TR and pixel electrode PIT connected to the normal transistor TR. As compared with the case that entire pixel PIX becomes the bright point, only a part of the inside of one pixel PIX becomes the bright point, so that the bright point defect can be made inconspicuous. As described above, even if the pixel defect due to abnormal transistor TR exists in one pixel PIX, the desired image can be displayed without making the bright point conspicuous.

In this way, the pixel defect can be made inconspicuous by forming the plurality of pixel electrodes PIT and the plurality of transistors TR in one pixel PIX. Consequently, the desired image can be displayed.

In the first exemplary embodiment, the wiring connection structure of 1G2D is adopted, and each two scanning lines GL are connected. Drain electrode D of transistor TR connected to one of the two connected scanning lines GL is connected to first video signal line SL1, and drain electrode D of transistor TR connected to the other of the two connected scanning lines GL is connected to second video signal line SL2.

With this configuration, an increase in writing voltage of the video signal at pixel PIX can be reduced. In particular, in the first exemplary embodiment, because the pixel width of one pixel PIX is much larger than 300 the writing voltage at pixel PIX becomes large, or writing in the pixel PIX is degraded, and an edge afterimage or display unevenness may be generated to degrade the image quality. However, the adoption of the wiring connection structure of 1G2D can effectively prevent the increase in writing voltage at pixel PIX and the degradation of the image quality.

In the first exemplary embodiment, as illustrated in FIG. 4, in planar view, first video signal line SL1 is located between first pixel electrode PIT1 of first pixel PIX1 and second pixel electrode PIT2 of second pixel PIX 2, and second video signal line SL2 overlaps line electrode PITL of second pixel electrode PIT2 of second pixel PIX2.

With this configuration, even if the pair of first video signal line SL1 and second video signal line SL2 is provided at each boundary between two adjacent pixels PIX, the plurality of line electrodes PITL of pixel electrode PIT can be formed at equal intervals using the space between first video signal line SL1 and second video signal line SL2. Consequently, even in the case that the plurality of transistors TR and the plurality of pixel electrodes PIT are formed in one pixel PIX, the difference in pixel capacitance $C_{PIX}$ can easily be reduced for all the pixel electrodes PIT. Thus, the image quality of liquid crystal display panel LCP can easily be improved.

Liquid crystal display panel LCP of the first exemplary embodiment includes common electrode MIT formed over the plurality of pixels PIX. Common electrode MIT covers at least one of first video signal line SL1 and second video signal line SL2. In the first exemplary embodiment, common electrode MIT covers both first video signal line SL1 and second video signal line SL2.

In this way, when common electrode MIT is formed over the plurality of pixels PIX, the electric field generated in the lower-layer wirings (such as first video signal line SL1 and second video signal line SL2) of common electrode MIT can be shielded by common electrode MIT. Consequently, the shape and size of pixel electrode PIT formed on common electrode MIT can freely be designed without being restricted by the layout of the wirings such as first video signal line SL1 and second video signal line SL2. That is, the degree of freedom in designing the shape and size of pixel electrode PIT is improved. Consequently, the light transmittance and the aperture ratio of pixel PIX can easily be improved.

Liquid crystal display panel LCP of the first exemplary embodiment includes common line CMT provided immediately above common electrode MIT.

In this way, the time constant of common electrode MIT can be decreased by providing common line CMT immediately above common electrode MIT. Consequently, the image quality of liquid crystal display panel LCP can further be improved.

In the first exemplary embodiment, common line CMT extends in the column direction, and overlaps first video signal line SL1 in planar view.

With this configuration, common line CMT can be disposed using first video signal line SL1 that is the light shielding portion, so that common line CMT made of the metal film can be added without degrading the aperture ratio of pixel PIX.

Common line CMT may overlap not first video signal line SL1 but second video signal line SL2.

Liquid crystal display panel LCP of the first exemplary embodiment includes first insulator PAS covering first video signal line SL1 and second video signal line SL2 and second insulator OPAS containing carbon and covering the first insulator PAS, and the thickness of second insulator OPAS is larger than the thickness of first insulator PAS.

With this configuration, the distance in the thickness direction between the wiring such as scanning line GL and video signal line SL and common electrode MIT can be increased, so that the parasitic capacitance generated by the wiring and common electrode MIT can be reduced. Consequently, the image quality of liquid crystal display panel LCP can further be improved.

In the first exemplary embodiment, first video signal line SL1 and second video signal line SL2 are not covered with light shielding layer BM. That is, line electrode PITL existing between first video signal line SL1 and second video signal line SL2 is not covered with light shielding layer BM.

With this configuration, even if first video signal line SL1 and second video signal line SL2 are formed at the boundary between the two pixels PIX, the region between two video signal lines SL1 and SL2 can also be constituted as the region contributing to image display by forming line electrode PITL between first video signal line SL1 and second video signal line SL2. As a result, the light transmittance and the aperture ratio of pixel PIX can be increased. Consequently, a wide display area of pixel PIX can be secured, so that the image quality of liquid crystal display panel LCP can further be improved.

On the contrary, first video signal line SL1, second video signal line SL2, and the region between first video signal line SL1 and second video signal line SL2 may be covered with light shielding layer BM formed along the column direction.

With this configuration, the light such as natural light can be shielded by light shielding layer BM, so that the degradation of image quality due to the reflection of the light such as external light from the surfaces of video signal line SL1 and second video signal line SL2 can be prevented even in the case that first video signal line SL1 and second video signal line SL2 are made of a metal material.

Alternatively, both first video signal line SL1 and second video signal line SL2 are not covered with light shielding layer BM, but one of first video signal line SL1 and second video signal line SL2 may be covered with light shielding layer BM formed along the column direction while the other of first video signal line SL1 and second video signal line SL2 is not covered with light shielding layer BM.

With this configuration, the light transmittance of pixel PIX can be increased, and the light such as natural light can be shielded. Consequently, the image quality of liquid crystal display panel LCP can be improved.

(Second Exemplary Embodiment)

Figure 12:
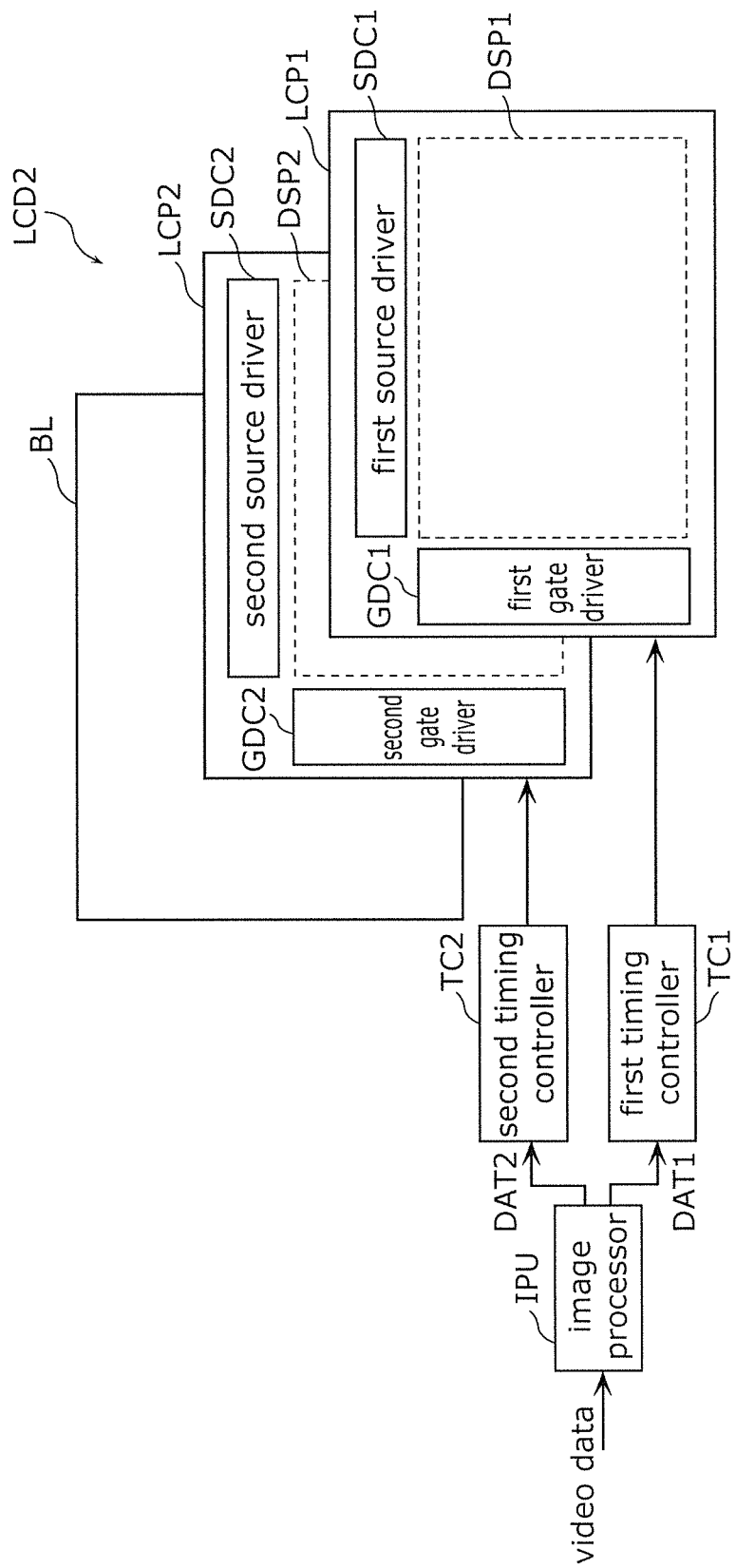
FIG. 12 is a view illustrating a schematic configuration of a liquid crystal display panel according to a second exemplary embodiment.
Figure 13A:
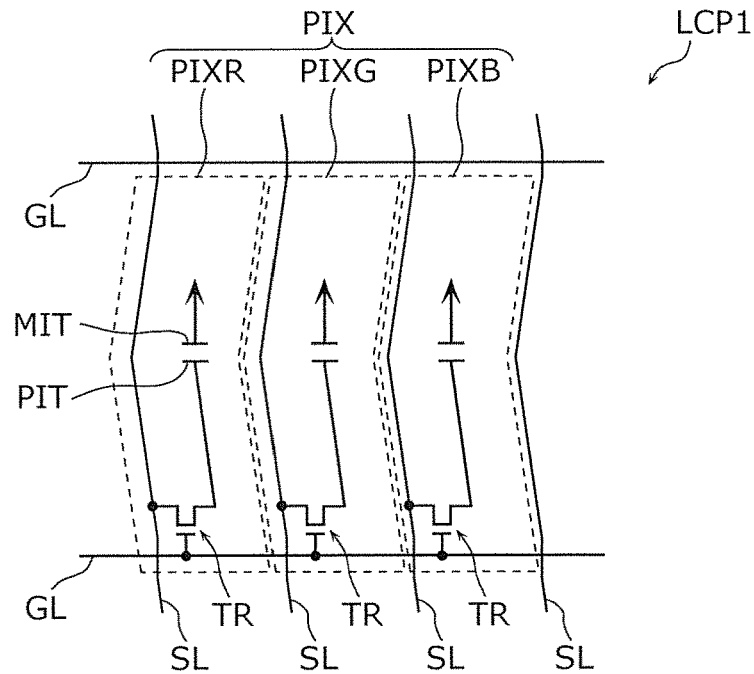
FIG. 13A is a view illustrating a layout of pixels of a first liquid crystal display panel in the liquid crystal display panel of the second exemplary embodiment.
Figure 13B:
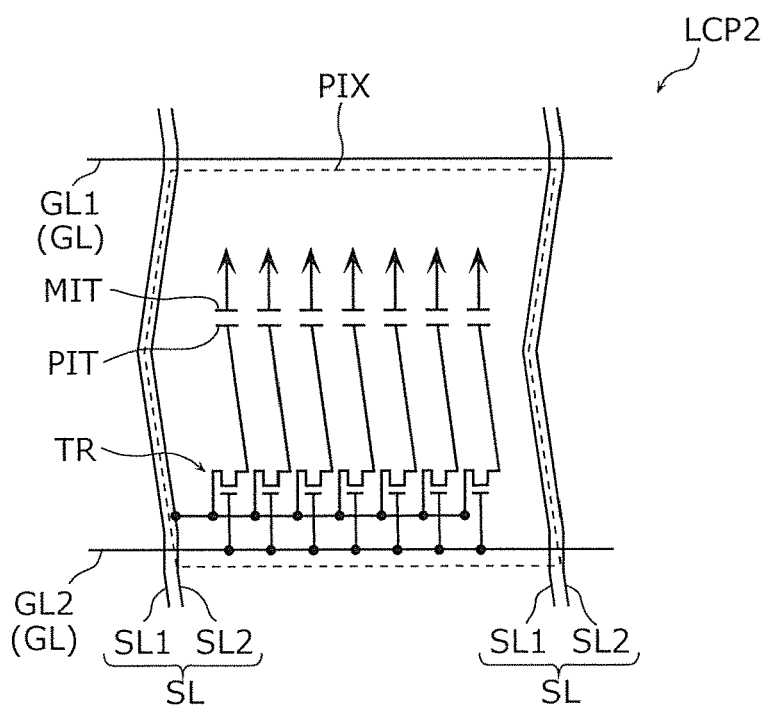
FIG. 13B is a view illustrating a layout of pixels of a second liquid crystal display panel in the liquid crystal display panel of the second exemplary embodiment.

Liquid crystal display panel LCD2 according to a second exemplary embodiment will be described below with reference to FIGS. 12, 13A, and 13B. FIG. 12 is a view illustrating the schematic configuration of liquid crystal display panel LCD2 of the second exemplary embodiment. FIG. 13A is a view illustrating a layout of pixels of first liquid crystal display panel LCP1 in liquid crystal display panel LCD2 of the second exemplary embodiment. FIG. 13B is a view illustrating a layout of pixels of second liquid crystal display panel LCP2 in liquid crystal display panel LCD2 of the second exemplary embodiment.

Liquid crystal display panel LCD2 is an image display device in which a plurality of liquid crystal display panels are superposed. Liquid crystal display panel LCP in the above exemplary embodiment is used as one of a plurality of liquid crystal display panels constituting liquid crystal display panel LCD2.

As illustrated in FIG. 12, liquid crystal display panel LCD2 includes first liquid crystal display panel LCP1 disposed at a position (front side) close to the observer, second liquid crystal display panel LCP2 disposed on a position (rear side) far from the observer with respect to first liquid crystal display panel LCP1, and backlight BL disposed on the rear side of second liquid crystal display panel LCP2. In the second exemplary embodiment, second liquid crystal display panel LCP2 is liquid crystal display panel LCP of the first exemplary embodiment.

Liquid crystal display panel LCP1 is a main panel that displays the image visually recognized by a user. In the second exemplary embodiment, first liquid crystal display panel LCP1 displays the color image. First source driver SDC1 and first gate driver GDC1 are provided in first liquid crystal display panel LCP1 in order to display the color image in first image display region DSP1 according to the input video signal. For example, the system for driving first liquid crystal display panel LCP1 is the transverse electric field method such as the IPS system. However, the present disclosure is not limited this configuration, but the system for driving first liquid crystal display panel LCP1 may be a Vertical Alignment (VA) system, a Twisted Nematic (TN) system, or the like.

On the other hand, second liquid crystal display panel LCP2 is a sub-panel disposed on the back side of first liquid crystal display panel LCP1. In the second exemplary embodiment, second liquid crystal display panel LCD2 displays the monochrome image (black-and-white image) of the image corresponding to the color image displayed on first liquid crystal display panel LCP1 in synchronization with the color image. Second source driver SDC2 and second gate driver GDC2 are provided in second liquid crystal display panel LCP2 in order to display the monochrome image in second image display region DSP2 according to the input video signal.

Backlight BL is the same as backlight BL used in liquid crystal display panel LCD 1 of the first exemplary embodiment.

Liquid crystal display panel LCD2 includes first timing controller TC1 that controls first source driver SDC1 and first gate driver GDC1 of first liquid crystal display panel LCP1, second timing controller TC2 that controls second source driver SDC2 and second gate driver GDC2 of second liquid crystal display panel LCP2, and image processor IPU that outputs the image data to first timing controller TC1 and second timing controller TC2.

In the second exemplary embodiment, image processor IPU receives the input video data transmitted from an external system, performs image processing on the input video data, outputs first image data DAT1 to first timing controller TC1, and outputs second image data DAT2 to second timing controller TC2. Image processor IPU also outputs a control signal (not illustrated) such as a synchronizing signal to first timing controller TC1 and second timing controller TC2. First image data DAT1 is image data used to display the color image, and second image data DAT2 is image data used to display the monochrome image.

As illustrated in FIGS. 13A and 13B, in liquid crystal display panel LCD2, the number of pixels PIX per unit area of first liquid crystal display panel LCP1 and the number of pixels PIX per unit area of second liquid crystal display panel LCP2 are equal to each other. The area of one pixel PIX of first liquid crystal display panel LCP1 is equal to the area of one pixel PIX of second liquid crystal display panel LCP2.

As illustrated in FIG. 13A, in first liquid crystal display panel LCP1, one pixel PIX includes three sub-pixels of red pixel PIXR, green pixel PIXG, and blue pixel PIXB. In the second exemplary embodiment, one pixel electrode PIT and one transistor TR are disposed in each of red pixel PIXR, green pixel PIXG, and blue pixel PIXB. However, the present disclosure is not limited this configuration.

In liquid crystal display panel LCD2 of the second exemplary embodiment, the image is displayed while two display panels of first liquid crystal display panel LCP1 and second liquid crystal display panel LCP2 overlap each other, so that black can be tightened. Consequently, the image having a high contrast ratio can be displayed.

For example, liquid crystal display panel LCD2 is a High Dynamic Range (HDR) compatible television, and the color image having the higher contrast ratio and the high image quality can be displayed using a backlight capable of performing local dimming control as backlight BL.

(Modifications)

The liquid crystal display panel and the liquid crystal display panel of the present disclosure are described above based on the exemplary embodiments, but the present disclosure is not limited to the exemplary embodiments.

For example, in the above exemplary embodiments, the plurality of line electrodes PITL in pixel electrode PIT are connected by two connection electrodes PITC. However, the connection electrode PITC on the side far from transistor TR in pixel PIX may not be provided. In this case, pixel electrode PIT becomes the comb-shaped electrode constructed with the plurality of line electrodes PITL.

In the above exemplary embodiments, video signal line SL is connected to drain electrode D of transistor TR, and pixel electrode PIT is connected to source electrode S of transistor TR. However, the present disclosure is not limited to this configuration. For example, video signal line SL may be connected to source electrode S of transistor TR, and pixel electrode PIT may be connected to drain electrode D of transistor TR.

In the above exemplary embodiments, the plurality of line electrodes PITL of pixel electrode PIT extend along the column direction (second direction). However, the present disclosure is not limited to this configuration. That is, a part or all of the plurality of line electrodes PITL may extend along the row direction (first direction). In this case, the plurality of line electrodes PITL are not limited to the case that the plurality of line electrodes PITL extend in parallel to the row direction, but the plurality of line electrodes PITL may extend obliquely with respect to the row direction, or may be bent into a substantial U-shape.

In the above exemplary embodiments, by way of example, common line CMT is provided immediately above common electrode MIT. However, the present disclosure is not limited to this configuration. Common line CMT may be configured as a layer below the common electrode MIT, namely, a layer provided on the side of first substrate SUB 1 with respect to common electrode MIT.

Those skilled in the art will readily appreciate that many modifications are possible in the above exemplary embodiment and variations without materially departing from the novel teachings and advantages of the present disclosure. Accordingly, all such modifications are intended to be included within the scope of the present disclosure.

What is claimed is:

1. A liquid crystal display panel having a plurality of pixels arranged in a matrix comprising:
    a plurality of transistors and a plurality of pixel electrodes provided in each of the plurality of pixels, and each of the plurality of pixel electrodes is electrically connected to a respective one of the plurality of transistors; and
    a plurality of pairs of first video signal lines and second video signal lines provided at a corresponding boundary between two pixels adjacent to each other in a first direction, the plurality of pairs of the first video signal lines and the second video signal lines extending in a second direction crossing to the first direction,
    wherein at least a part of the pixel electrodes exists between a first video signal line of a pair of the plurality of pairs of first video signal lines and second video signal lines and a second video signal line of the pair of the plurality of pairs of first video signal lines and second video signal lines,
    each pixel electrode of the plurality of pixel electrodes includes a plurality of line electrodes,
    at least one of the plurality of line electrodes exists between the first video signal line and the second video signal line,
    an interval between two adjacent pixel electrodes is equal to an interval between two adjacent line electrodes in one pixel electrode, and
    a first pixel electrode among the plurality of pixel electrodes of one pixel and a second pixel electrode among the plurality of pixel electrodes of another adjacent pixel are next to each other in the first direction, the first video signal line parallels to the line electrodes of the second pixel electrode and overlaps at least two adjacent line electrodes of the second pixel electrode in planar view, and the second video signal line is located between the first pixel electrode and the second pixel electrode in planar view.

2. The liquid crystal display panel according to claim 1, further comprising:
    a plurality of scanning lines, each of which is disposed at a boundary between corresponding two pixels adjacent to each other in the second direction and extends in the first direction,
    wherein
    gate electrodes of the plurality of transistors are connected to a corresponding one of the plurality of scanning lines,
    first conductive electrodes of the plurality of transistors are connected to a corresponding one of the plurality of pixel electrodes,
    each two of the plurality of scanning lines are connected to each other,
    a second conductive electrode of a transistor connected to one of the connected two scanning lines is connected to one of the first video signal line and the second video signal line, and
    a second conductive electrode of a transistor connected to the other of the two connected scanning lines is connected to the other of the first video signal line and the second video signal line.

3. The liquid crystal display panel according to claim 1, wherein the plurality of line electrodes extend in the second direction.

4. The liquid crystal display panel according to claim 1, wherein each pixel electrode further includes a connection electrode connecting the plurality of line electrodes.

5. The liquid crystal display panel according to claim 1, further comprising a common electrode formed over the plurality of pixels, wherein the common electrode covers at least one of the first video signal line and the second video signal line.

6. The liquid crystal display panel according to claim 5, further comprising a common line electrically connected to the common electrode.

7. The liquid crystal display panel according to claim 6, wherein the common line extends in the second direction, and overlaps the first video signal line or the second video signal line in planar view.

8. The liquid crystal display panel according to claim 1, further comprising:
    a first insulator covering the first video signal line and the second video signal line; and
    a second insulator containing carbon and covering the first insulator,
    wherein a thickness of the second insulator is larger than a thickness of the first insulator.

9. The liquid crystal display panel according to claim 1, wherein the line electrode existing between the first video signal line and the second video signal line is not covered with a light shielding layer.

10. The liquid crystal display panel according to claim 1, wherein one of the first video signal line and the second video signal line is covered with a light shielding layer formed along the second direction, and
the other of the first video signal line and the second video signal line is not covered with the light shielding layer formed along the second direction.

11. The liquid crystal display panel according to claim 1, wherein the first video signal line and the second video signal line are covered with a light shielding layer formed along the second direction.

* * * * *